(12) United States Patent
Do et al.

(10) Patent No.: US 8,121,242 B2
(45) Date of Patent: Feb. 21, 2012

(54) FREQUENCY LOCK STABILITY IN DEVICE USING OVERLAPPING VCO BANDS

(75) Inventors: Viet Linh Do, Carlsbad, CA (US); Mehmet Mustafa Eker, San Marcos, CA (US); Simon Pang, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 496 days.

(21) Appl. No.: 12/388,024

(22) Filed: Feb. 18, 2009

(65) Prior Publication Data

US 2009/0147904 A1    Jun. 11, 2009

Related U.S. Application Data

(63) Continuation-in-part of application No. 12/372,946, filed on Feb. 18, 2009, which is a continuation of application No. 12/327,776, filed on Dec. 3, 2008, which is a continuation-in-part of application No. 12/194,744, filed on Aug. 20, 2008, which is a continuation-in-part of application No. 12/120,027, filed on May 13, 2008, which is a continuation-in-part of application No. 11/717,261, filed on Mar. 12, 2007, now Pat. No. 7,560,426, and a continuation-in-part of application No. 11/954,325, filed on Dec. 12, 2007, application No. 12/388,024, which is a continuation-in-part of application No. 11/595,012, filed on Nov. 9, 2006, now Pat. No. 7,720,189.

(51) Int. Cl.
 *H03D 3/24* (2006.01)

(52) U.S. Cl. ........ 375/376; 375/373; 375/371; 375/354; 331/179; 331/17; 327/141; 327/142; 327/147; 713/400

(58) Field of Classification Search ................. 375/376, 375/373, 371, 354; 331/179, 17, 177; 327/141, 327/142, 147; 713/400
See application file for complete search history.

(56) References Cited

U.S. PATENT DOCUMENTS 6,806,786 B1 * 10/2004 Lam et al. ...................... 331/179
2006/0140309 A1 * 6/2006 Kuo et al. ...................... 375/326

OTHER PUBLICATIONS

Pottbacker et al., "A Si Bipolar Pahse and Frequency Detector IC for Clock Extraction up to 8 Gb/s", IEEE Journal of Solid-State Circuits, vol. SC-27, pp. 1747-1751, Dec. 1992.
C. Andrew Sharpe, "A 3-State phase detector can improve your next PLL design", EDN Magazine, pp. 224-228, Sep. 20, 1976.
Charles Hogge Jr., "A Self Correcting Clock Recovery Circuit", IEEE Journal of Lightwave Technology, vol. LT-3, pp. 1312-1314, Dec. 1985.

\* cited by examiner

*Primary Examiner* — Kevin M Burd
*Assistant Examiner* — Zewdu Kassa
(74) *Attorney, Agent, or Firm* — Law Office of Gerald Maliszewski; Gerald Maliszewski

(57) ABSTRACT

A system and method are provided for frequency lock stability in a receiver using overlapping voltage controlled oscillator (VCO) bands. An input communication signal is accepted and an initial VCO is selected. Using a phase-locked loop (PLL) and the initial VCO, the frequency of the input communication signal is acquired and the acquired signal tuning voltage of the initial VCO is measured. Then, the initial VCO is disengaged and a plurality of adjacent band VCOs is sequentially engaged. The acquired signal tuning voltage of each VCO is measured and a final VCO is selected that is able to generate the input communication signal frequency using an acquired signal tuning voltage closest to a midpoint of a predetermined tuning voltage range.

20 Claims, 17 Drawing Sheets

| Mode | total_contribution[4:0] | total_contribution values |
|---|---|---|
| First Order | contribution1 = $c_1[n]$ | 0,1 |
| Second Order | contribution1 + contribution2 = $c_1[n] + c_2[n] - c_2[n-1]$ | -1,0,1,2 |
| Third Order | contribution1 + contribution2 + contribution3 = $c_1[n] + c_2[n] - c_2[n-1] + c_3[n] - 2c_3[n-1] + c_3[n-2]$ | -3,-2,-1,0,1,2,3,4 |
| Fourth Order | contribution1 + contribution2 + contribution3 + contribution4 = $c_1[n] + c_2[n] - c_2[n-1] + c_3[n] - 2c_3[n-1] + c_3[n-2] + c_4[n] - 3c_4[n-1] + 3c_4[n-2] - c_4[n-3]$ | -7,-6,-5,-4,-3,-2, -1,0,1,2,3,4,5,6,7,8 |

*FIG. 2*
*(Prior Art)*

FREQUENCY LOCK STABILITY IN DEVICE USING OVERLAPPING VCO BANDS

RELATED APPLICATIONS

This application is a continuation-in-part of a pending application entitled, AUTO FREQUENCY ACQUISITION MAINTENANCE IN A CLOCK AND DATA RECOVERY DEVICE, invented by Do et al., Ser. No. 12/372,946, filed Feb. 18, 2009, which is a continuation-in-part of:

a pending application entitled, FREQUENCY HOLD MECHANISM IN A CLOCK AND DATA RECOVERY DEVICE, invented by Do et al., Ser. No. 12/327,776, filed Dec. 3, 2008, which is a continuation-in-part of:

a pending application entitled, FREQUENCY REACQUISITION TN A CLOCK AND DATA RECOVERY DEVICE, invented by Do et al., Ser. No. 12/194,744, filed Aug. 20, 2008, which is a continuation-in-part of:

a pending application entitled, FREQUENCY SYNTHESIS RATIONAL DIVISION, invented by Do et al., Ser. No. 12/120,027, filed May 13, 2008, which is a continuation-in-part of:

application entitled, HIGH SPEED MULTI-MODULUS PRESCALAR DIVIDER, invented by An et al., Ser. No. 11/717,261, filed Mar. 12, 2007 now U.S. Pat. No. 7,560,426; and, FLEXIBLE ACCUMULATOR FOR RATIONAL DIVISION, invented by Do et al., Ser. No. 11/954,325, filed Dec. 12, 2007.

This application is a continuation-in-part of a pending application entitled, SYSTEM AND METHOD FOR AUTOMATIC CLOCK FREQUENCY ACQUISITION, invented by Do et al., Ser. No. 11/595,012, filed Nov. 9, 2006 now U.S. Pat. No. 7,720,189. All the above-referenced applications are incorporated herein by reference.

BACKGROUND OF THE INVENTION

1. Field of the Invention

This invention generally relates to a phase-locked loop (PLL) frequency synthesis system and, more particularly, to a system and method for maximizing frequency lock stability in receiver utilizing a plurality of voltage controlled oscillators with overlapping frequency bands.

2. Description of the Related Art

Voltage controlled oscillators are commonly used in monolithic clock data recovery (CDR) units, as they're easy to fabricate and provide reliable results. Clock recovery PLLs generally don't use phase-frequency detectors (PFDs) in the data path since the incoming data signal isn't deterministic. PFDs are more typically used in frequency synthesizers with periodic (deterministic) signals. Clock recovery PLLs use exclusive-OR (XOR) based phase detectors to maintain quadrature phase alignment between the incoming data pattern and the re-timed pattern. XOR based phase detectors have limited frequency discrimination capability, generally restricting frequency offsets to less than the closed loop PLL bandwidth. This characteristic, coupled with the wide tuning range of the voltage controlled oscillator (VCO), requires CDR circuits to depend upon an auxiliary frequency acquisition system.

There are two basic PLL frequency acquisition techniques. The first is a VCO sweep method. During an out-of-lock condition, auxiliary circuits cause the VCO frequency to slowly sweep across its tuning range in search of an input signal. The sweeping action is halted when a zero-beat note is detected, causing the PLL to lock to the input signal. The VCO sweep method is generally used in microwave frequency synthesis applications. The second type of acquisition aid, commonly found in clock recovery circuits, uses a PFD in combination with an XOR phase detector. When the PLL is locked to a data stream, the PLL switches over to a PFD that is driven by a stable reference clock source. The reference clock frequency is proportional to the data stream rate. For example, if the data stream rate is D and the reference clock rate is R, then D α R. However, since the reference clock has only a few rate settings, it is unlikely that R is equal to the receive data rate. To create a reference equal to the data rate a fractional ratio of R must be used; such as D=n/d*R.

In this manner, the VCO frequency is held very close to the data rate. Keeping the VCO frequency in the proper range of operation facilitates acquisition of the serial data and maintains a stable downstream clock when serial data isn't present at the CDR input. When serial data is applied to the CDR, the XOR based phase detector replaces the PFD, and data re-timing resumes.

It is common for a PLL to use a divider in the feedback path, so that the PFD can operate at lower frequencies. In the simplest case, the divisor is a fixed integer value. Then, a frequency divider is used to produce an output clock that is an integer multiple of the reference clock. If the divider cannot supply the required divisor, or if the output clock is not an integer multiple of the reference clock, the required divisor may be generated by toggling between two integer values, so that an average divisor results. By placing a fractional divider (1/N) into this feedback path, a fractional multiple of the input reference frequency can be produced at the output of this fractional-N PLL.

However, it is difficult to determine a divisor, either fixed or averaged, if the frequency of the data stream is not known beforehand. For this reason, CDR devices are typically designed to operate at one or more predetermined data stream baud rates.

Conventional fractional-N frequency synthesizers use fractional number decimal values in their PLL architectures. Even synthesizers that are conventionally referred to as "rational" frequency synthesizers operate by converting a rational number, with an integer numerator and integer denominator, into resolvable or approximated fractional numbers. These frequency synthesizers do not perform well because of the inherent fractional spurs that are generated in response to the lack of resolution of the number of bits representing the divisor in the feedback path of the frequency synthesizer.

FIG. 1 is a schematic block diagram depicting an accumulator circuit capable of performing a division operation (prior art). As noted in "A Pipelined Noise Shaping Coder for Fractional-N Frequency Synthesis", by Kozak et al., IEEE Trans. on Instrumentation and Measurement, Vol. 50, No. 5, October 2001, the depicted $4^{th}$ order device can be used to determine a division ratio using an integer sequence.

The carry outs from the 4 accumulators are cascaded to accumulate the fractional number. The carry outs are combined to reduce quantization noise by adding their contributions are follows:

contribution $1=c1[n]$;

contribution $2=c2[n]-c2[n-1]$;

contribution $3=c3[n]-2c3[n-1]+c3[n-2]$;

contribution $4=c4[n]-3c4[n-1]+3c4[n-2]-c4[n-3]$;

where n is equal to a current time, and (n−1) is the previous time, Cx[n] is equal to a current value, and Cx[n−1] is equal to a previous value.

FIG. 2 shows the contributions made by the accumulator depicted in FIG. 1 with respect to order (prior art). A fractional number or fraction is a number that expresses a ratio of a numerator divided by a denominator. Some fractional numbers are rational—meaning that the numerator and denominator are both integers. With an irrational number, either the numerator or denominator is not an integer (e.g., π). Some rational numbers cannot be resolved (e.g., 10/3), while other rational numbers may only be resolved using a large number of decimal (or bit) places. In these cases, or if the fractional number is irrational, a long-term mean of the integer sequence must be used as an approximation.

The above-mentioned resolution problems are addressed with the use of a flexible accumulator, as described in parent application Ser. No. 11/954,325. The flexible accumulator is capable of performing rational division, or fractional division if the fraction cannot be sufficiently resolved, or if the fraction is irrational. The determination of whether a fraction is a rational number may be trivial in a system that transmits at a single frequency, especially if the user is permitted to select a convenient reference clock frequency. However, modern communication systems are expected to work at a number of different synthesized frequencies using a single reference clock. Further, the systems must be easily reprogrammable for different synthesized frequencies, without changing the single reference clock frequency.

As noted above, modern communication systems are expected to operate at a number of frequencies. In some circumstances the communication signal frequencies are unknown (not predetermined). While it is relatively straightforward to reacquire the phase of a signal if the signal frequency is predetermined, it is necessarily more difficult to reacquire phase if the frequency is unknown. These difficulties are compounded if the system is expected to work over a wide frequency range. In that case, a large number of VCOs are required to cover the entire range. However, VCO operating characteristics are subject to temperature variations and fabrication tolerances. If a VCO is selected that is operating at the edge of its band, it may be unable to properly track an incoming communication signal. Alternately, the system may develop hysteresis as it toggles between different VCOs. A VCO that is operating at the center of its band is likely to continue to track an incoming signal, even as the system temperatures change. Thus, the VCO required to synthesize frequencies at start-up, may not be the optimal VCO when the system is operating at a temperature. Likewise, different fabrication lots may require different optimal VCOs for locking to the same frequency.

It would be advantageous if a VCO could be selected that operates near the center of its frequency band, as part of the process for frequency locking to an input communication signal.

SUMMARY OF THE INVENTION

In a continuous rate CDR system, frequency ratio detection is performed after the phase-locked loop (PLL) has been locked by a phase detector (PHD). If the CDR system is locked, the frequency range of the selected voltage controlled oscillator (VCO) band already is known. A calculated frequency ratio resides within this frequency range. If the received signal is temporarily lost, if the received signal frequency varies, or if the received signal is bursty, it is possible to take advantage of the calculated frequency ratio. Using a rotational frequency detector (RFD) and the calculated frequency ratio, the device is able to hold on to the received signal frequency, and then acquire phase. If the RFD cannot acquire the input signal, the AFA mode is enabled, which begins by coarsely estimating the input signal frequency, and continues by locking to the frequency of the input signal. Advantageously, the CDR disclosed herein is able to acquire frequency using the most stable (frequency-centered) VCO available.

Frequency locking stability prevents oscillation in the VCO selection process, and provides a deterministic search algorithm to guarantee the optimal VCO band selection despite temperature variations. The process provides a fast frequency search mechanism for handling VCO band changes by using charge pump initializations, and addresses the effect of variations in VCO fabrication.

Accordingly, a method is provided for frequency lock stability using overlapping VCO bands. In a receiving device including a plurality of VCOs with overlapping frequency bands, an input communication signal is accepted and an initial VCO is selected. Using a PLL and the initial VCO, the frequency of the input communication signal is acquired and the acquired signal tuning voltage of the initial VCO is measured. Then, the initial VCO is disengaged and a plurality of adjacent band VCOs is sequentially engaged. The acquired signal tuning voltage of each VCO is measured and a final VCO is selected that is able to generate the input communication signal frequency using an acquired signal tuning voltage closest to a midpoint of a predetermined tuning voltage range.

In one aspect, the final VCO is selected using a process that divides the tuning voltage range into a plurality of data points, and compares the acquired signal tuning voltage of each VCO to the data points. Then, the VCO is selected having the fewest number of data points between the acquired signal tuning voltage and the midpoint of the tuning voltage range. For example, the number of data points between the voltage range midpoint and the acquired signal tuning voltage is counted for each VCO. The count for each VCO is compared and the VCO with the lowest count is selected.

Additional details of the above-described method and a system for frequency lock stability in a receiver device are presented below.

BRIEF DESCRIPTION OF THE DRAWINGS

FIG. 2 shows the contributions made by the accumulator depicted in FIG. 1 with respect to order (prior art).

DETAILED DESCRIPTION

Figure 1:
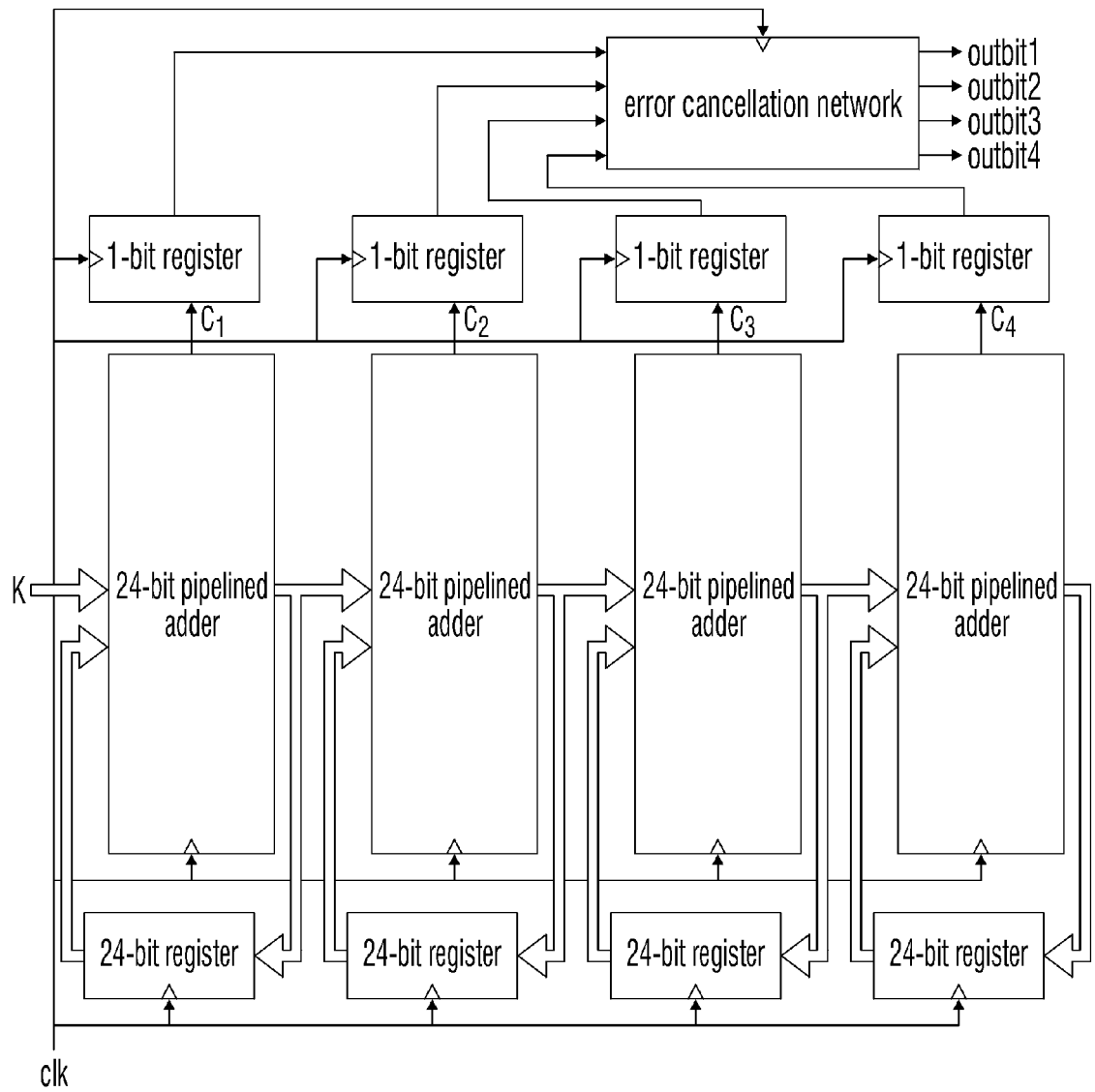
FIG. 1 is a schematic block diagram depicting an accumulator circuit capable of performing a division operation (prior art).

Various embodiments are now described with reference to the drawings. In the following description, for purposes of explanation, numerous specific details are set forth in order to provide a thorough understanding of one or more aspects. It may be evident, however, that such embodiment(s) may be practiced without these specific details. In other instances, well-known structures and devices are shown in block diagram form in order to facilitate describing these embodiments.

As used in this application, the terms "processor", "processing device", "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Various embodiments will be presented in terms of systems that may include a number of components, modules, and the like. It is to be understood and appreciated that the various systems may include additional components, modules, etc. and/or may not include all of the components, modules etc. discussed in connection with the figures. A combination of these approaches may also be used.

The various illustrative logical blocks, modules, and circuits that have been described may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC. The ASIC may reside in the node, or elsewhere. In the alternative, the processor and the storage medium may reside as discrete components in the node, or elsewhere in an access network.

Figure 3:
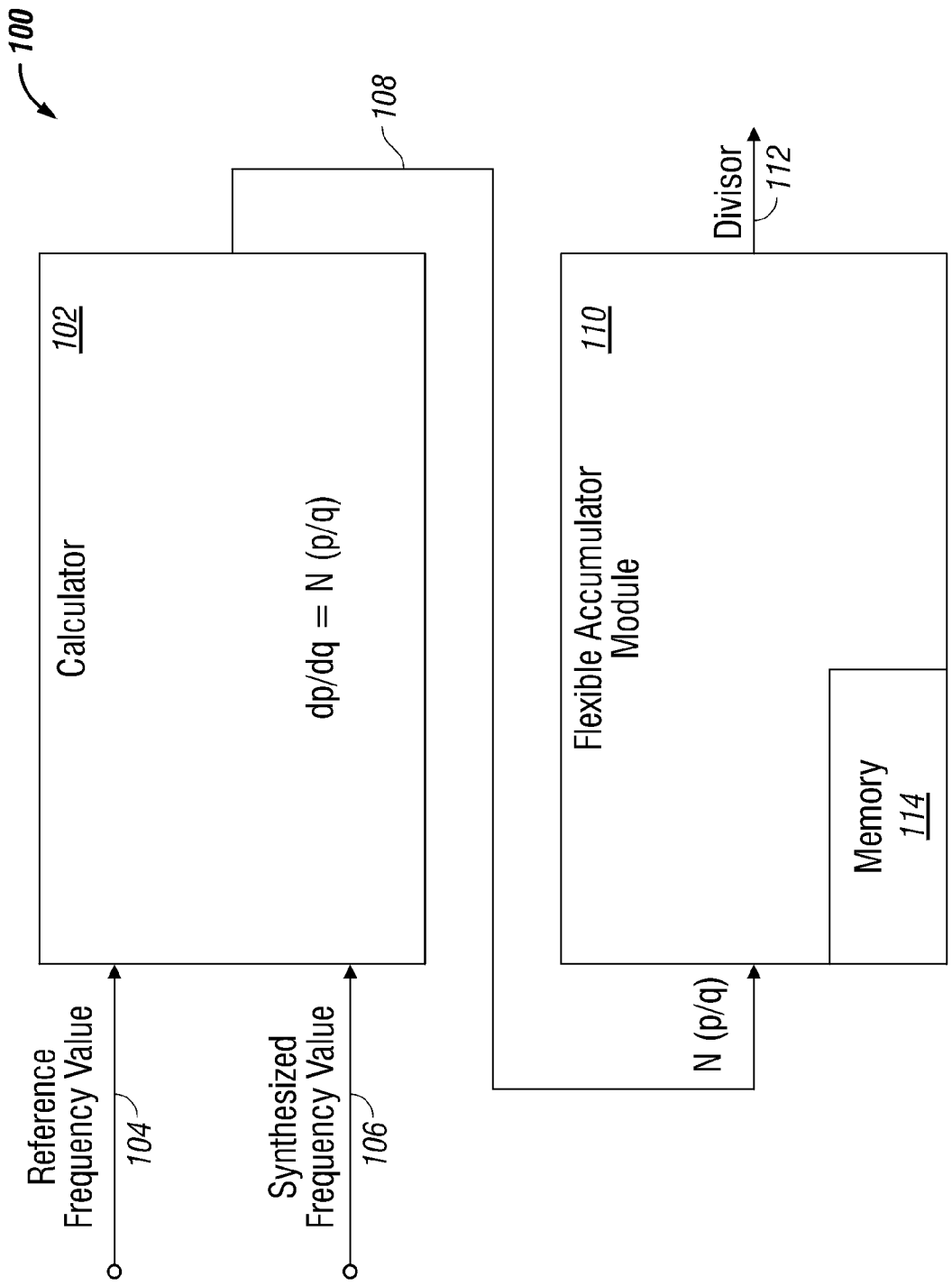
FIG. 3 is a schematic block diagram depicting a system for synthesizing signal frequencies using rational division.

FIG. 3 is a schematic block diagram depicting a system for synthesizing signal frequencies using rational division. The system 100 comprises a calculator 102 having an input on line 104 to accept a reference frequency value and an input on line 106 to accept a synthesized frequency value. The calculator 102 divides the synthesized frequency value by the reference frequency value, and determines an integer value numerator (dp) and an integer value denominator (dq). The calculator 102 reduces the ratio of dp/dq to an integer N and a ratio of p/q (dp/dq=N(p/q)), where p/q<1 (decimal). The calculator 102 supplies N(p/q), where p is a numerator and q is a denominator, at an output on line 108. A flexible accumulator module 110 has an input on line 108 to accept N(p/q) and an output on line 112 to supply a divisor. For example, the calculator 102 may supply an n-bit binary numerator and an (n+1)-bit binary denominator. The divisor may be stored in a tangible memory medium (e.g., random access memory (RAM) or non-volatile memory) for subsequent use, as described below.

Figure 4:
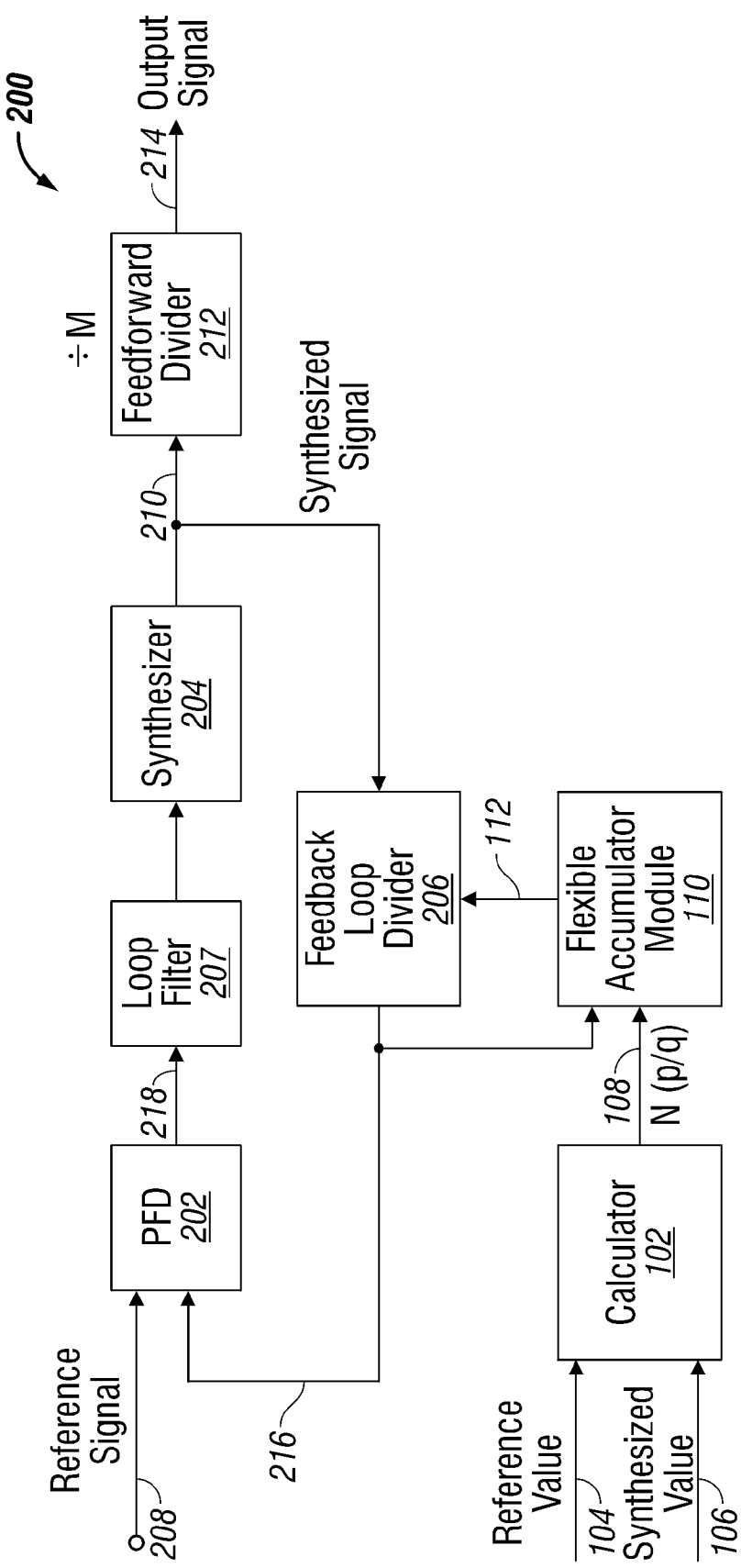
FIG. 4 is a schematic block diagram depicting the system of FIG. 3 is the context of a phase-locked loop (PLL).

FIG. 4 is a schematic block diagram depicting the system of FIG. 3 is the context of a phase-locked loop (PLL) 200. The PLL 200 includes a phase/frequency detector (PFD) 202, a frequency synthesizer 204, and a feedback loop divider 206. Typically, a PLL may also include a loop filer and charge pump 207. The PFD 202 accepts a reference signal on line 208 having a frequency equal to the reference frequency value. The frequency synthesizer 204 generates a synthesized signal on line 210 having a frequency equal to the synthesized frequency value. The flexible accumulator module 110 sums N with a k-bit quotient, creates the divisor, and supplies the divisor to the feedback loop divider 206 on line 112.

Figure 5:
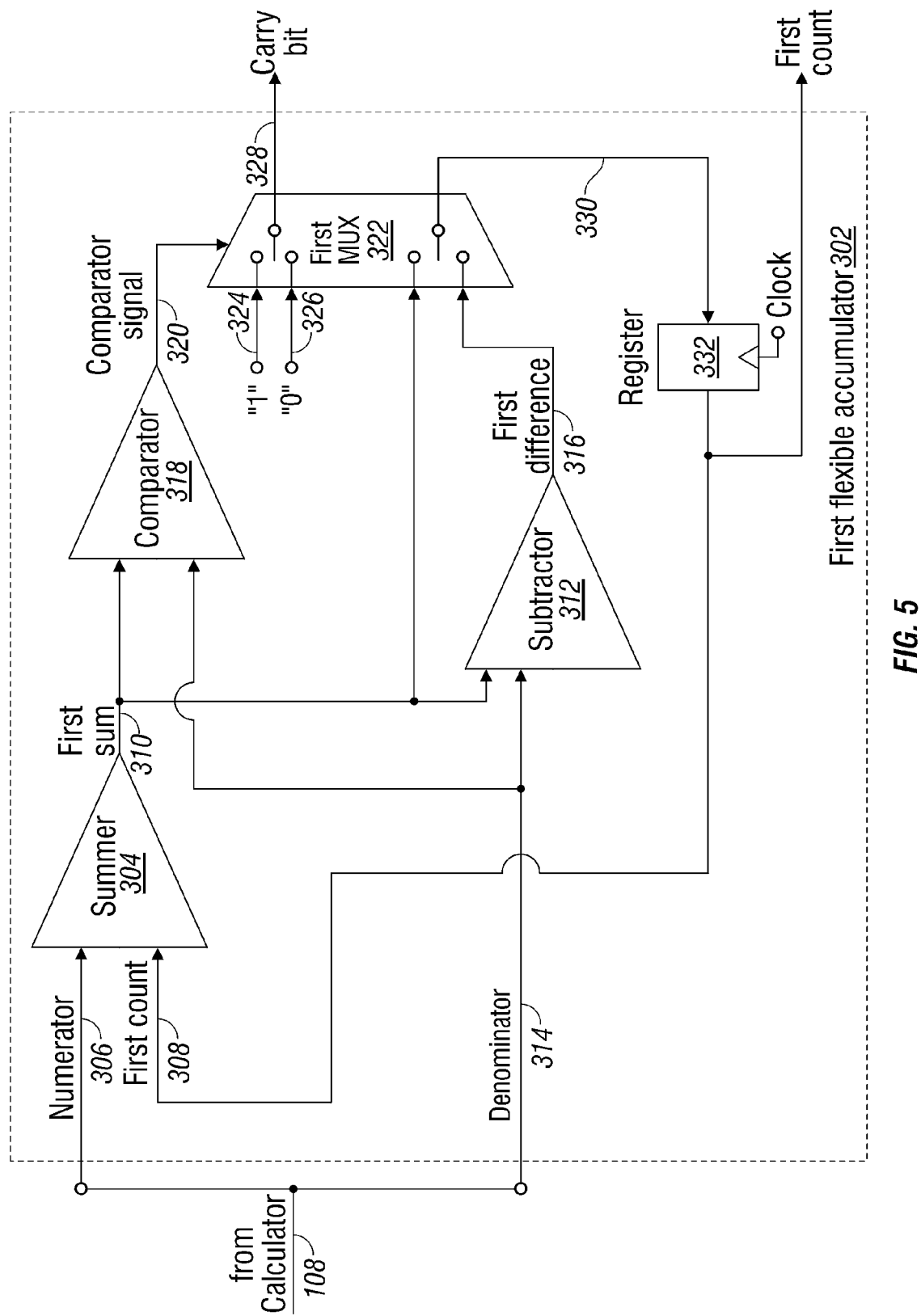
FIG. 5 is a schematic block diagram depicting a first flexible accumulator of the flexible accumulator module.

FIG. 5 is a schematic block diagram depicting a first flexible accumulator of the flexible accumulator module. A flexible accumulator is capable of either rational or fractional division. As explained in more detail below, rational division relies upon the use of a numerator (dividend) and a denominator (divisor) that are used to form a true rational number. That is, the numerator and denominator are integer inputs to the flexible accumulator. Alternately stated, the input need not be a quotient derived from a numerator and denominator. The first flexible accumulator 302 includes a first summer 304 having an input on line 306 to accept a binary numerator (p). Summer 304 has an input on line 308 to accept a binary first count from a previous cycle and an output on line 310 to supply a binary first sum of the numerator and the first count.

A first subtractor 312 has an input on line 314 to accept a binary denominator (q), an input on line 310 to accept the first sum, and an output on line 316 to supply a binary first difference between the first sum and the denominator. Note: the numerator (p) and denominator (q) on lines 306 and 314, respectively, are components of the information supplied by the calculator on line 108. A first comparator 318 has an input on line 310 to accept the first sum, an input on line 314 to accept the denominator, and an output on line 320 to supply a first comparator signal. A first multiplexer (MUX) 322 has an input to accept carry bits. A "1" carry bit is supplied on line 324 and a "0" carry bit is supplied on line 326. The MUX 322 has a control input on line 320 to accept the first comparator signal, and an output on line 328 to supply a first carry bit in response to the first comparator signal.

More explicitly, the first MUX 322 supplies a binary "1" first carry bit on line 328 if the first comparator signal on line 320 indicates that the first sum is greater than the denominator. The MUX 322 supplies a binary "0" first carry bit if the first comparator signal indicates that the first sum is less than or equal to the denominator. The first MUX 322 has an input on line 310 to accept the first sum, an input on line 316 to accept the first difference, and an output on line 330 to supply the first count in response to the comparator signal. Note: the first count from first MUX 322 on line 330 becomes the first count from a subsequent cycle on line 308 after passing through clocked register or delay circuit 332. As explained in more detail below, line 308 may also connected as an output port (count) to another, higher order flexible accumulator.

The first MUX 322 supplies the first difference as the first count on line 308 for the subsequent cycle if the first comparator signal indicates that the first sum is greater than the denominator. The first MUX 322 supplies the first sum as the first count in the subsequent cycle if the first comparator signal indicates that first sum is less than or equal to the denominator. Alternately but not shown, the accumulator may be comprised of two MUX devices, one for selecting the carry bit and one for selecting the first count.

In one aspect, the first summer accepts an n-bit binary numerator on line 306, an n-bit first count on line 308 from the previous cycle, and supplies an (n+1)-bit first sum on line 310. The first subtractor 312 accepts an (n+1)-bit binary denominator on line 314 and supplies an n-bit first difference on line 316.

Typically, first summer 304 accepts the numerator with a value, and the first subtractor 312 accepts the denominator with a value larger than the numerator value. In one aspect, the combination of the numerator and denominator form a rational number. That is, both the numerator and denominator are integers. However, the numerator and denominator need not necessarily form a rational number. Alternately expressed, the first summer 304 may accept an n-bit numerator that is a repeating sequence of binary values, or the numerator may be the most significant bits of a non-repeating sequence. The non-repeating sequence may be represented by r, an irrational number or a rational number that cannot be resolved (does not repeat) within a span of n bits. In this aspect, the first subtractor 312 accepts an (n+1)-bit denominator with a value equal to decimal $2^{(n+1)}$. Additional details of the flexible accumulator module can be found in parent application Ser. No. 11/954,325.

Figure 6:
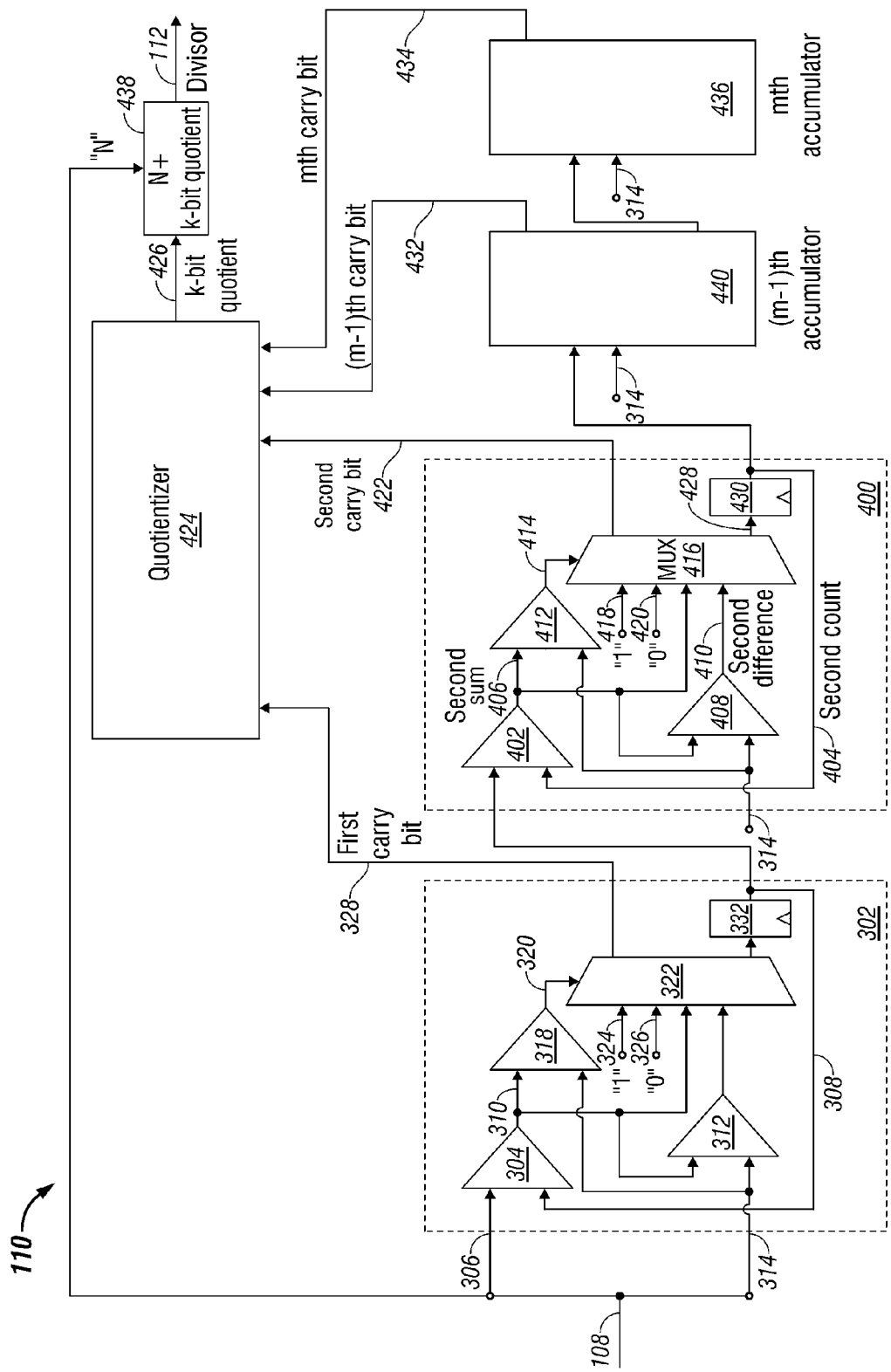
FIG. 6 is a schematic block diagram depicting the flexible accumulator module as a plurality of series-connected flexible accumulators.

FIG. 6 is a schematic block diagram depicting the flexible accumulator module as a plurality of series-connected flexible accumulators. Generally, the flexible accumulator module generates a binary sequence from each flexible accumulator and uses a plurality of binary sequences to generate the k-bit quotient.

A quotientizer 424 has an input on line 328 to accept the first binary sequence, an input on line 422 to accept the second binary sequence, and an output on line 426 to supply a k-bit quotient generated from the first and second binary sequences. In total, the flexible accumulator module 110 comprises m flexible accumulators, including an (m−1)th accumulator 440 and an mth accumulator 436. In this example, m=4. However, the module 110 is not limited to any particular number of flexible accumulators. Thus, the quotientizer has inputs 328, 422, 432, and 434 to accept m=4 binary sequences and the output 426 supplies a k-bit quotient generated from the m binary sequences. In one aspect, the quotientizer 424 derives the quotient as shown in FIGS. 1 and 2, and as explained below. Circuit 438 sums the k-bit quotient on line 426 with the integer N to supply the divisor on line 112.

A fourth order system, using four series-connected accumulators has been depicted as an example. However, it should be understood that the system is not limited to any particular number of accumulators. Although the above-described values have been defined as binary values, the system could alternately be explained in the context of hexadecimal or decimal numbers.

Figure 7:
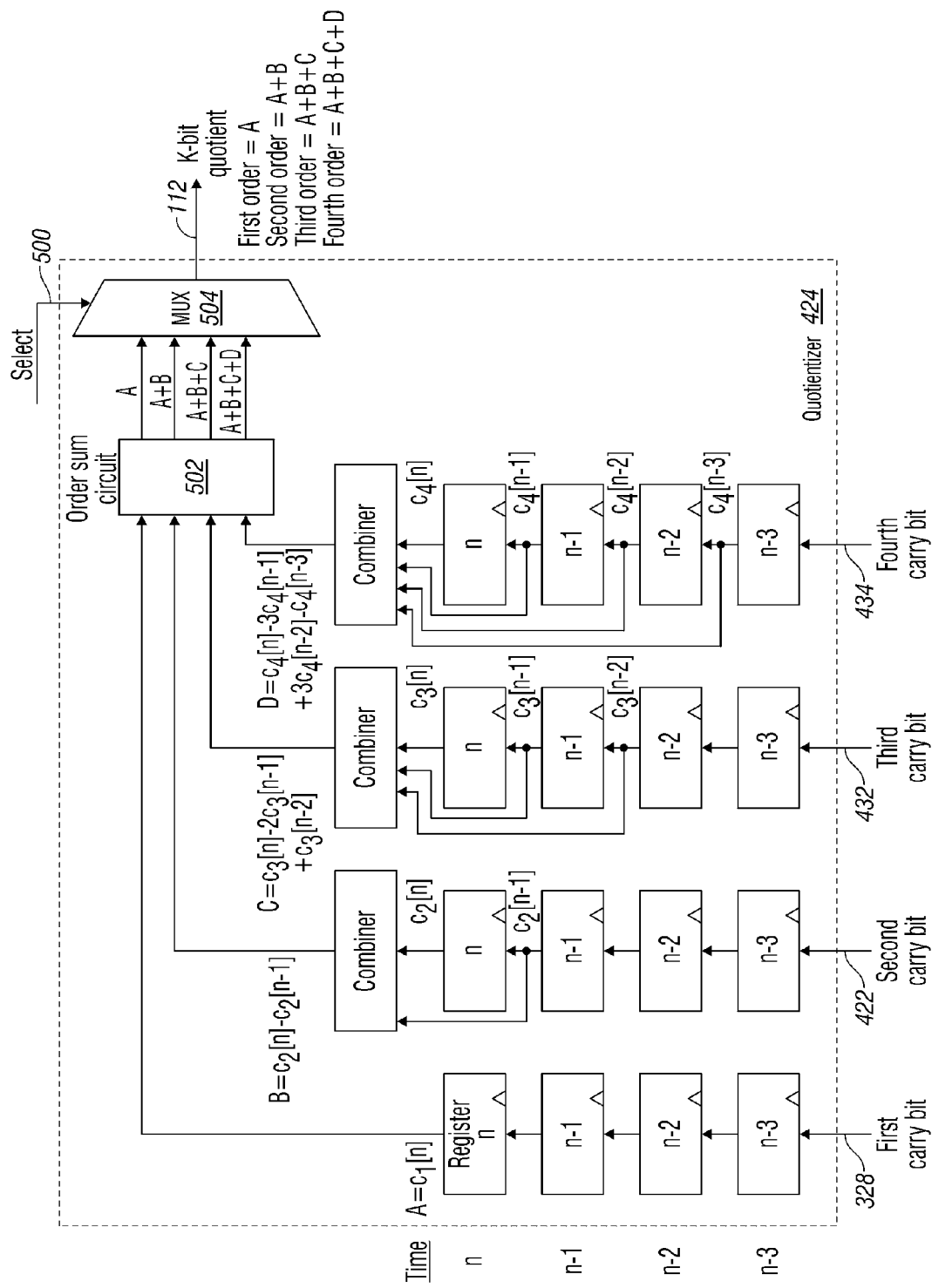
FIG. 7 is a schematic block diagram depicting the quotientizer of FIG. 6 in greater detail.

FIG. 7 is a schematic block diagram depicting the quotientizer of FIG. 6 in greater detail. Returning to the calculation of the quotient, the number of bits required from each contribution block is different. From FIG. 2 it can see that each order requires a different number of bits. For example, the first contribution (contributions) has only two values: 0 and 1. So, only 1 bit is needed. There is no need for a sign bit, as the value is always positive. The second contribution has possible 4 values: −1, 0, 1, and 2. So, 3 bits are needed, including 1 sign bit. The third contribution has 7 values: −3 to 4. So, 4 bits are required, including 1 sign bit. The fourth contribution has 15 values: −7 to 8. So, 5 bits are required, including 1 sign bit.

To generalize for "k" (the k-bit quotient), Pascal's formula may be used to explain how many bits is necessary for each contribution (or order). For an m-order calculator, there are m flexible accumulators and m binary sequences. Each binary sequence (or carry bit) is connected to the input of one of the m sequences of shift registers. Thus, there are m signals combined from the m shift register sequences, corresponding to the m-binary sequences (or m-th carry bit) found using Pascal's formula. A 4-order calculator is shown in FIG. 7, with 4 shift register (delay) sequences, with each shift register sequence including 4 shift registers.

As a simplified alternative, each contribution may be comprised of the same number of bits, k, which is the total contribution (or order) for all contributions. These k-bit contributions are 2 complement numbers. In FIG. 2, k is equal to 5 bits [4:0].

The accumulator does not generate a sign bit. However, the carry outs from the accumulators are modulated in the calculator and the sign bit is generated. For example, the $2^{nd}$ order contribution=c2[n]−c2[n−1]. If c2[n]=0 and c2[n−1]=1, then the $2^{nd}$ order contribution=0−1=−1. Similarly, the third order contribution=c3[n]−2c3[n−1]+c3[n−2]. If c3[n]=0, c3[n−1]=1, and c3[n−2]=0, then the $3^{rd}$ order contribution=0−2×1+0=−2. For the $4^{th}$ order contribution=c4[n]−3c4[n−1]+3c4[n−2]−c4[n−3]. If c4[n]=0, c4[n−1]=1, c4[n−2]=0, and c4[n−3]=1, then the $4^{th}$ order contribution=0−3×1+3×0−1=−4. These contributions are added together in the "order sum circuit" 502 on the basis of order, and the order is chosen using MUX 504 and the select signal on line 500. FIG. 7 depicts one device and method for generating a quotient from accumulator carry bits. However, the system of FIG. 6 might also be enabled using a quotientizer that manipulates the accumulator carry bits in an alternate methodology.

Returning to FIG. 4, in one aspect the calculator 102 defines a resolution limit of j radix places, sets q=dq, and determines p. The calculator 102 supplies p and q to a flexible accumulator module 110 enabled for rational division when p can be represented as an integer using j, or less, radix places. Alternately, the calculator 102 supplies N(r/q) to a flexible accumulator module enabled for fractional division, where r is a non-resolvable number, when p cannot be represented as an integer using j radix places. When enabled for fractional division, r is supplied as the "numerator" on line 306 (see FIG. 5). Then, the "denominator" on line 314 is represented as an integer with a value larger than the fractional number. For example, the fractional number of line 306 may be an unresolved 31-bit binary number and the integer on line 314 may be a 32-bit number where the highest order radix place is "1" and all the lower orders are "0". Alternately stated, r may be a 31-bit non-resolvable numerator, and q a 32-bit denominator with a value equal to decimal $2^{32}$. In one aspect, r is "rounded-off" to a resolvable value.

In one aspect, the PLL 200 of FIG. 4 includes a feedforward divider 212 to accept the synthesized signal on line 210 and an output on line 214 to supply an output signal having a frequency=(synthesized signal frequency)/M. In this aspect, the flexible accumulator module 110 creates the divisor by summing N, the k-bit quotient, and M. Likewise, the calculator 102 reduces to ratio M(dp/dq)=N(p/q)).

Figure 8:
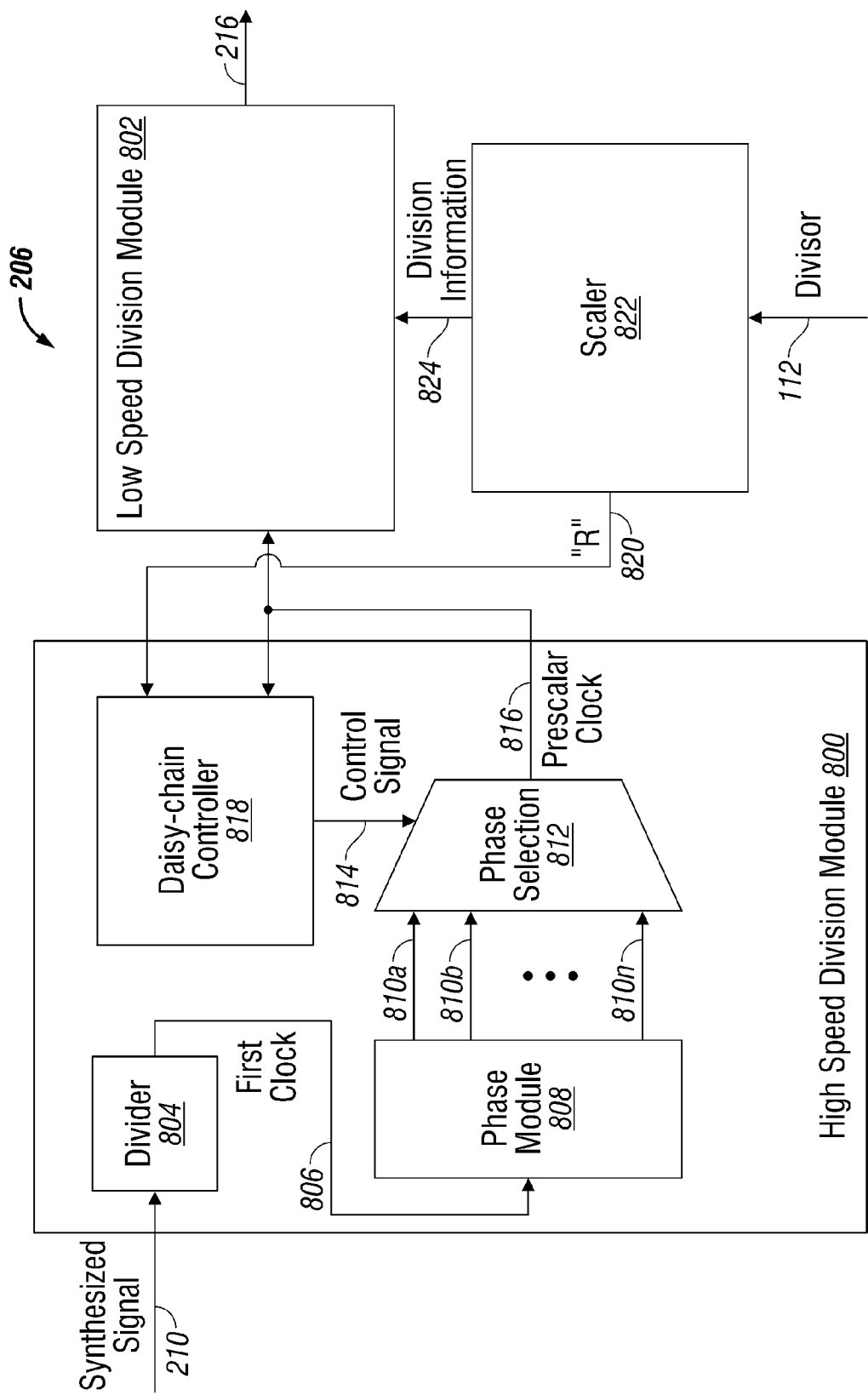
FIG. 8 is a schematic block diagram depicting the feedback loop divider of FIG. 4 is greater detail.

FIG. 8 is a schematic block diagram depicting the feedback loop divider of FIG. 4 is greater detail. The feedback loop divider 206 includes a high-speed division module 800 and a low-speed division module 802. The high-speed module 800 includes a divider 804 having an input on line 210 to accept the synthesized signal and an output on line 806 to supply a first clock signal having a frequency equal to the (synthesized signal frequency)/J. A phase module 808 has an input on line 806 to accept the first clock and an output on lines 810a through 810n to supply a plurality of phase outputs, each having the first clock frequency. Typically, the phase module 808 generates a first clock with a first number of equally-spaced phase outputs. For example, n may be equal to 8, meaning that 8 first clock signals are supplied, offset from the nearest adjacent phase by 45 degrees. A phase selection multiplexer 812 has an input on lines 810a-810n to accept the plurality of first clock phase outputs, an input on line 814 to accept a control signal for selecting a first clock signal phase, and an output on line 816 to supply a prescalar clock with a frequency equal to the (synthesized signal frequency)/R, where R=J·S.

A daisy-chain register controller 818 has an input on line 820 to accept the pre-divisor value R and an output on line 814 to supply the control signal for selecting the first clock phase outputs. A low-speed module 822 has an input on line 816 to accept the prescalar clock and an output on line 216 to supply a divided prescalar clock with a frequency equal to the (divisor/R). A scaler 822 accepts the divisor on line 112, supplies the R value of line 820, and supplies division information to the low speed divider 802 on line 824. Returning briefly to FIG. 4, the PFD 202 compares the divided prescalar clock frequency on line 216 to the reference clock frequency and generates a synthesized signal correction voltage on line 218. In some aspects, the divided prescalar clock signal on line 216 is feedback to the flexible accumulator module 110.

Figure 9:
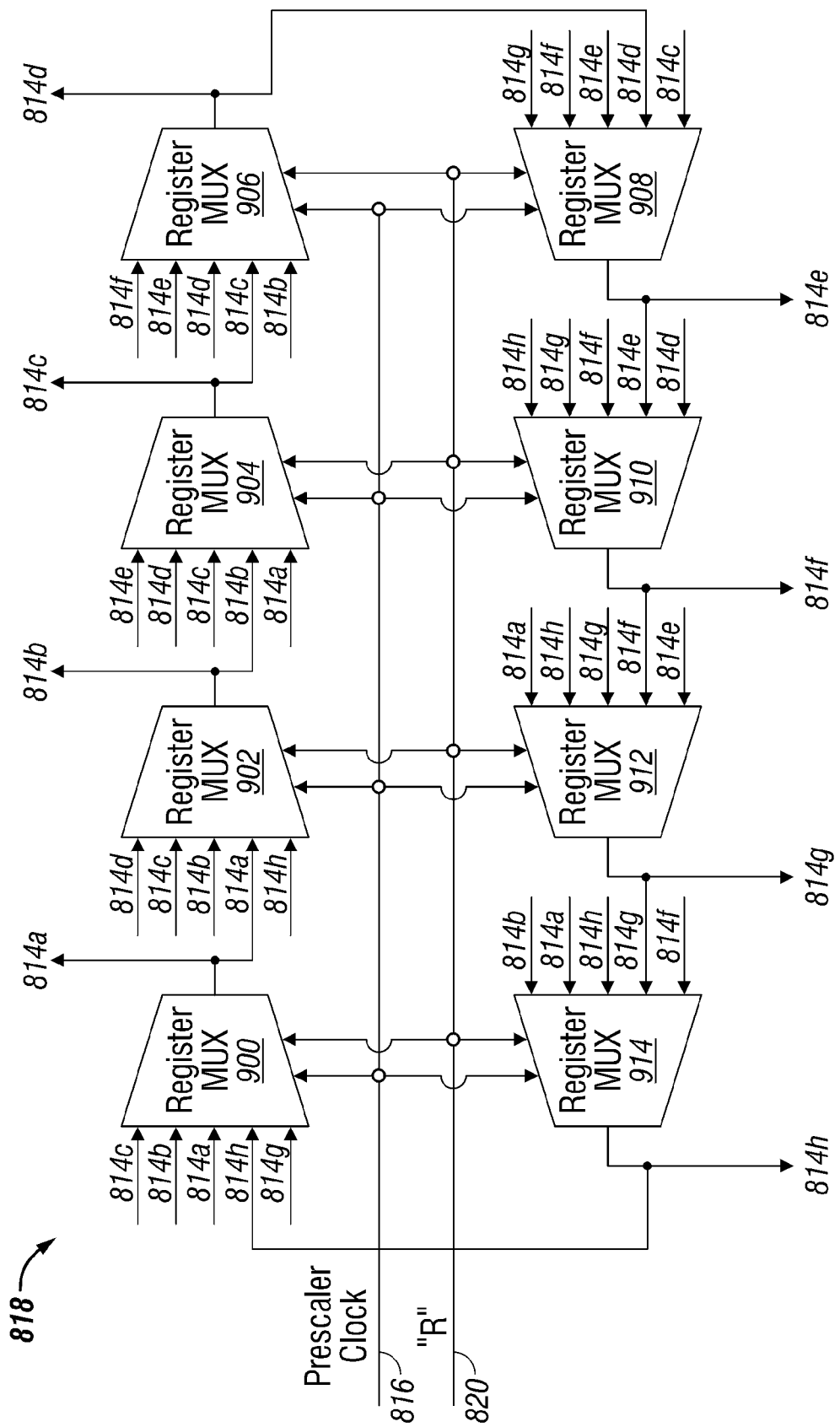
FIG. 9 is a block diagram depicting the daisy-chain controller of FIG. 8 in greater detail.

FIG. 9 is a block diagram depicting the daisy-chain controller of FIG. 8 in greater detail. The daisy-chain register controller 818 accepts the prescalar clock on line 816 as a clock signal to registers 900 through 914 having outputs connected in a daisy-chain. The controller 818 generates a sequence of register output pulses 814a through 814h in response to the clock signals, and uses the generated register output pulses to select the first clock phase outputs.

The daisy-chain register controller 818 iteratively selects sequences of register output pulses until a first pattern of register output pulses is generated. Then, the phase selection multiplexer (816, see FIG. 8) supplies phase output pulses having a non-varying first period, generating a prescalar clock frequency equal to the (first clock frequency)·S, where S is either an integer or non-integer number. Additional details of the high speed divider and daisy-chain controller may be found in parent application Ser. No. 11/717,261.

Figure 10:
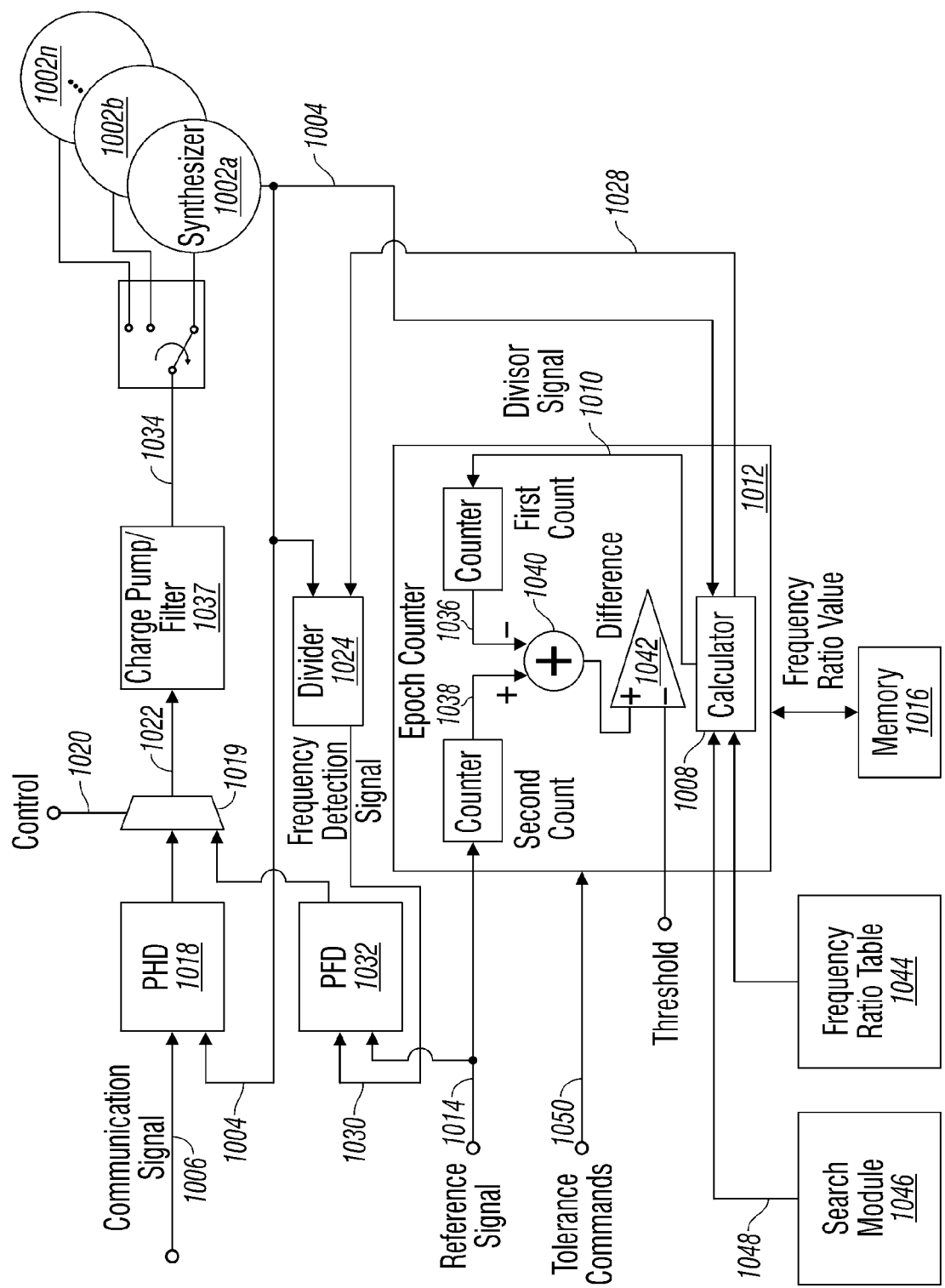
FIG. 10 is a schematic block diagram depicting a system for reacquiring a non-synchronous communication signal in a clock and data recovery (CDR) device frequency synthesizer.

FIG. 10 is a schematic block diagram depicting a system for reacquiring a non-synchronous communication signal in a clock and data recovery (CDR) device frequency synthesizer. It should be understood that aspects of the system 1000 are enabled by, or work in junction with elements of the system described above in FIGS. 3-9. System 1000 comprises a first synthesizer 1002a having an output on line 1004 to supply a synthesized signal having an output frequency locked in phase to a non-synchronous communication signal on line 1006, which has an input data frequency. A calculator module 1008 has an input to accept the synthesized signal on line 1004. The calculator module 1008 selects a frequency ratio value, divides the output frequency by the selected frequency ratio value, and supplies a divisor signal having a divisor frequency at an output on line 1010.

An epoch counter 1012 has an input on line 1010 to accept the divisor signal frequency and an input on line 1014 to accept a reference signal frequency. The epoch counter 1012 compares the divisor frequency to the reference signal frequency, and in response to the comparing, saves the frequency ratio value in a tangible memory medium 1016.

A phase detector (PHD) 1018 is shown, selectable engaged in a phase-lock mode in response to a control signal to multiplexer (MUX) 1019 on line 1020, with an input on line 1006 to accept the communication signal, an input on line 1004 to accept the synthesized signal, and an output on line 1022 to supply phase information. One example of a PHD can be found in an article authored by Charles Hogge Jr. entitled, "A Self Correcting Clock Recovery. Circuit", IEEE Journal of Lightwave Technology, Vol. LT-3, pp. 1312-1314, December 1985, which is incorporated herein by reference. However, other phase detector designs are also suitable.

A phase-frequency detector (PFD) 1032 is selectable engaged in the frequency acquisition mode, responsive to a control signal on line 1020. The PFD 1032 has an input on line 1014 to accept the reference signal frequency, an input on line 1030 to accept a frequency detection signal, and an output on line 1022 to supply frequency information. Thus, the first synthesizer 1002a has an input on line 1034 to accept either phase information in the PHD mode or frequency information in the PFD mode. Also shown is a charge pump/filter 1037 interposed between lines 1022 and 1034. One example of a PFD can be found in an article authored by C. Andrew Sharpe entitled, "A 3-state phase detector can improve your next PLL design", EDN Magazine, pp. 224-228, Sep. 20, 1976, which is incorporated herein by reference. However, other phase detector designs are also suitable.

A divider 1024 is engaged in the frequency acquisition (PFD) mode. The divider has an input on line 1028 to accept the frequency ratio value, an input on line 1004 to accept the synthesized signal output frequency, and an output on line 1030 to supply a frequency detection signal equal to the output frequency divided by the frequency ratio value.

The epoch counter 1012 retrieves the frequency ratio value from memory 1016 for supply to the divider 1024, in response to a loss of lock between the synthesized signal and the communication signal in the phase-lock mode, triggering the frequency acquisition mode.

The PHD 1018 compares the communication signal on line 1006 to the synthesized signal on line 1004 in the phase-lock mode and reacquires the phase of the communication signal, subsequent to PFD loop supplying a synthesized signal having the first frequency in the PFD mode.

The calculator 1008 selects a frequency ratio value equal to the output frequency divided by the reference frequency. The epoch counter 1012 compares the divisor signal frequency to the reference signal frequency by counting divisor signal cycles and creating a first count on line 1036. The epoch counter 1012 also counts reference signal cycles and creates a second count on line 1038. The epoch counter 1012 finds the difference between the first and second counts, as represented by summing circuit 1040, and compares the difference to a maximum threshold value input, as represented using comparator 1042.

In one aspect, the epoch counter 1012 compares the difference to the maximum threshold value by ending a coarse search for a frequency ratio value if the difference is less than the maximum threshold value, and reselects a frequency ratio value if the difference is greater than the maximum threshold value. The calculator 1008 selects the frequency ratio value by accessing a range of frequency ratio values corresponding to a range of output frequencies from table 1044. For example, the calculator 1008 selects a first frequency ratio value from the range of frequency ratio values, and reselects the frequency ratio value by selecting a second frequency value from the range of frequency ratio values in table 1044.

In one aspect, a search module 1046 has an output on line 1048 to supply search algorithm commands based upon a criteria such as step size, step origin, step direction, and combinations of the above-mentioned criteria. The calculator 1008 selects the first and second frequency ratio values in response to the search algorithm commands accepted at an input on line 1048.

In one aspect, the epoch counter 1012 compares the divisor frequency to the reference signal frequency by creating first and second counts with respect to a first time duration, and subsequent to ending the coarse search, initiates a fine search by creating first and second counts with respect to a second time duration, longer than the first time duration. In other words, the fine search uses a longer time period to collect a greater number of counts for comparison.

In another aspect, the epoch counter 1012 has an input on line 1050 to accept tolerance commands for selecting the maximum threshold value. Then, the calculator 1008 reselects a frequency ratio value if the difference is greater than the selected maximum tolerance value.

In one aspect, the system 1000 includes a plurality of synthesizers, each having a unique output frequency band. Shown are synthesizers 1002a, 1002b, and 1002n, where n is not limited to any particular value. The first synthesizer 1002a is selected from the plurality of synthesizers prior to the frequency detector acquiring the communication signal input data frequency in the frequency acquisition mode. If the system cannot acquire the input data frequency using the first synthesizer 1002a, then second synthesizer 1002b may be selected, until a synthesizer is found that can be locked to the input data frequency.

Figure 11:
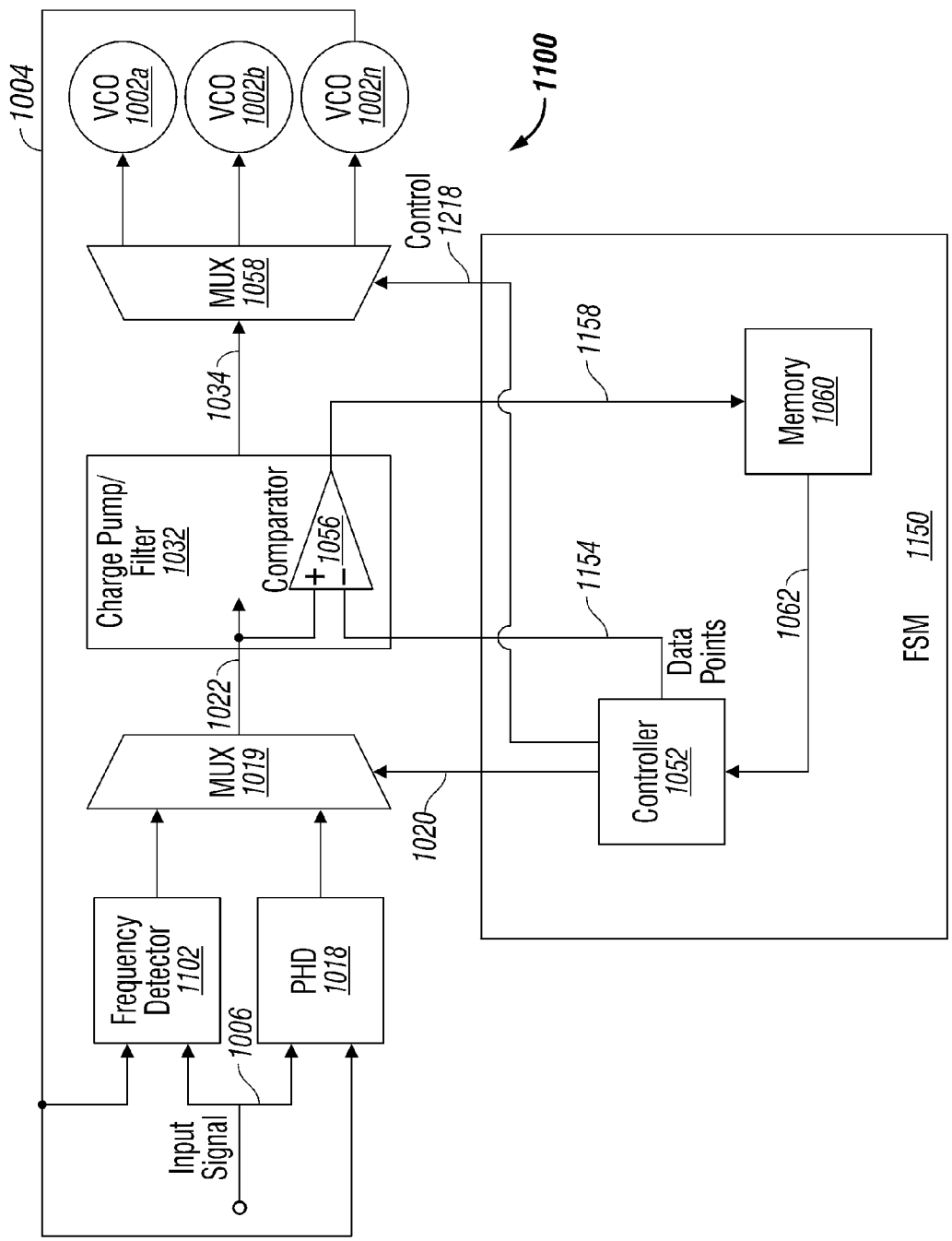
FIG. 11 is a schematic block diagram depicting a system for frequency lock stability in a receiver using a plurality of voltage controlled oscillators (VCOs) with overlapping frequency bands.

FIG. 11 is a schematic block diagram depicting a system for frequency lock stability in a receiver using a plurality of voltage controlled oscillators (VCOs) with overlapping frequency bands. The system 1100 comprises a plurality of VCOs 1002 for generating VCO signals in overlapping frequency bands. Shown are VCOs 1002a, 1002b, and 1002n. For example, VCO 1002a may have a frequency band of 1 gigahertz (GHz) to 2 GHz in response to a tuning voltage of 0 to 5 volts. VCO 1002b may have a band of 1.5 GHz to 2.5 GHz over the same tuning range, and VCO 1002n may have a band of 2 GHz to 3 GHz. Although the variable n is equal to three in this example, the system is not limited to any particular number of VCOs.

The system 1100 also includes a phase-locked loop (PLL) including a frequency detector 1102 to acquire the frequency of an input communication signal on line 1006, with respect to a VCO signal on line 1004. The frequency detector 1102 has an output on line 1022 to supply a VCO tuning voltage. An initial VCO (e.g., VCO 1002a) has an input on line 1034 to accept the tuning voltage and an output on line 1004 to supply the VCO signal. As in FIG. 10, the PLL also includes a charge pump/filter 1037 interposed between the frequency detector and the VCO.

A multiplexer (MUX) 1058 has an input to accept the tuning voltage from the frequency detector on line 1034, a control signal input on line 1218, and a plurality of selectable outputs. Each output is connected to a corresponding VCO to supply the tuning voltage in response to the control signal. A frequency stability module (FSM) 1150 has an interface on line 1022 to measure tuning voltage and an output on line 1218 to supply the control signal to the MUX 1058. The FSM 1150 measures the acquired signal tuning voltage of the initial VCO, disengages the initial VCO, and sequential engages a plurality of adjacent band VCOs. As used herein, the term "acquired signal tuning voltage" is tuning voltage needed for a VCO to frequency-lock the incoming communication signal. The FSM 1150 measures the acquired signal tuning voltage of each VCO and selects a final VCO able to generate the input communication signal frequency using an acquired signal tuning voltage closest to a midpoint of a predetermined tuning voltage range. Continuing the example started above, the FSM 1150 would pick the VCO able to generate the needed frequency, at a tuning voltage closest to the tuning voltage range midpoint of 2.5 volts, assuming a voltage range of 0 to 5 volts.

As shown in more detail, the FSM 1150 includes a controller 1152 to supply data point voltages on line 1154. A comparator 1156, embedded with the charge pump 1037, has a first input on line 1022 to accept the acquired signal tuning voltage, a second input on line 1154 to accept the data point voltages, and an output to supply a voltage comparison on line 1158. Memory 1160 has an interface on line 1158 to record the voltage comparisons for each VCO. The controller 1152 has an interface on line 1062 to access the record of voltage comparisons in memory 1060, and an output on line 1218 to supply a control signal to the MUX 1058. The controller 1152 selects the final VCO as the one with the fewest number of data points between the acquired signal tuning voltage and the midpoint of the tuning voltage range.

In one aspect, the memory 1160 records a count of the number of data points between the tuning voltage range midpoint and the acquired signal tuning voltage for each VCO. The controller 1152 accesses the count for each VCO from memory 1160 and selects the VCO with the lowest count. In another aspect, the controller 1152 supplies the comparator 1156 with plurality of data points for each VCO selected from either a low range data points between a minimum voltage and the midpoint of the tuning voltage range, or a high range data points between a maximum voltage and the midpoint of the tuning voltage range. The memory 1160 records a count of the number of data points in the selected range between the acquired signal tuning voltage and the midpoint of the tuning voltage range. In one aspect, the controller 1152 supplies an initialization voltage on line 1022, or after the charge pump/filter (not shown), after selecting a VCO that is approximately equal to an estimated acquired signal tuning voltage.

The system of FIG. 11 operates on the assumption that the input communication signal is known, or that the system receives knowledge of the input signal frequency from another source (not shown). In this manner, an initial VCO can be selected, that while perhaps not optimal, is able to capture the input signal.

In one aspect, the frequency detector 1102 is a selectively enabled and the PLL includes a phase detector (PHD) 1018 that is selectively enabled. The frequency detector 1102 and PHD 1018 are enabled through the use of MUX 1019, with control signal supplied by the controller 1152 on line 1020. The PHD 1018 is enabled subsequent to the frequency detector acquiring the frequency of the input communication signal using the final VCO. The PHD 1018 is used to acquire the phase of the input communication signal on line 1006.

Figure 12:
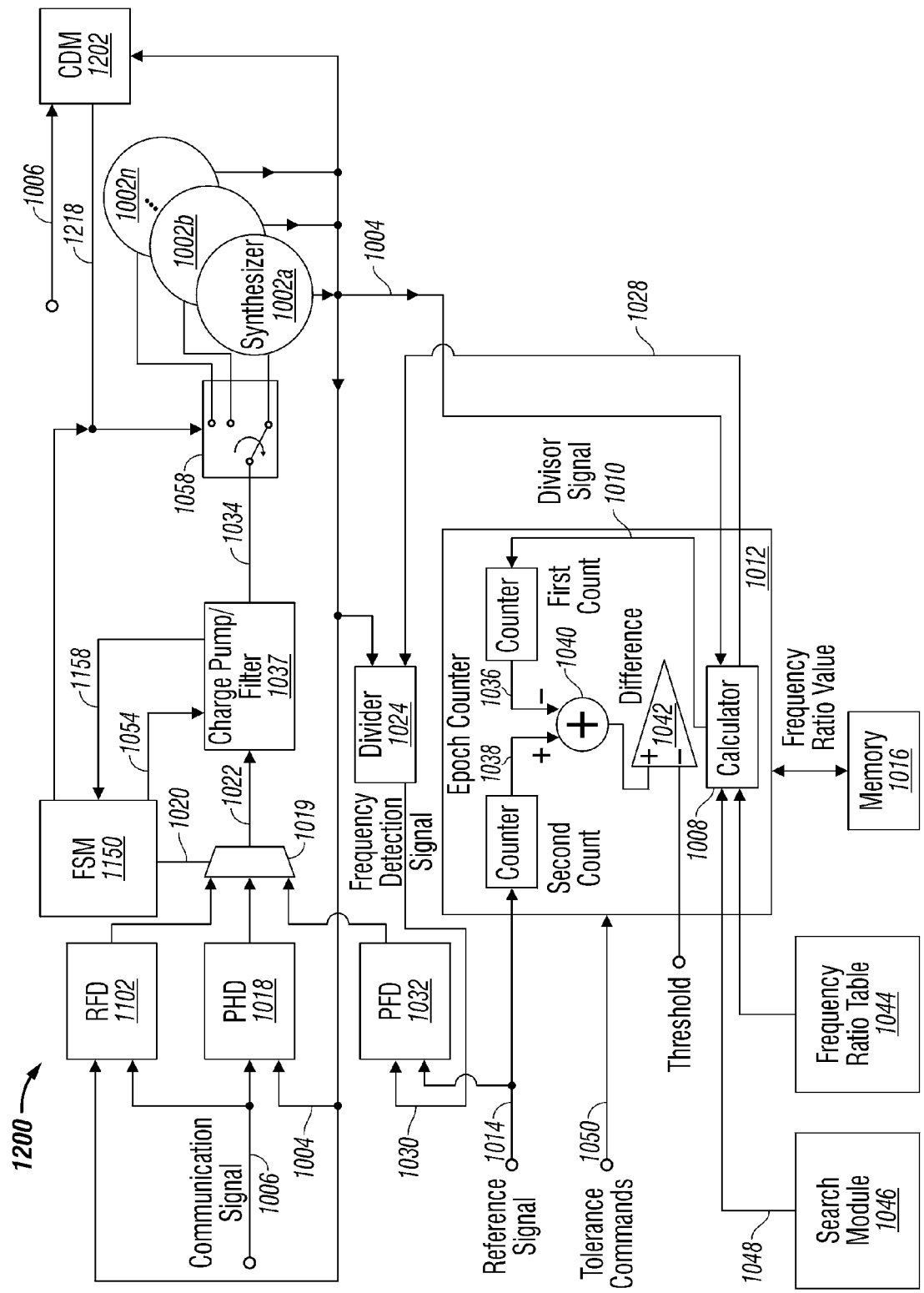
FIG. 12 is a variation of the system of FIG. 11 where the receiver is part of a clock and data recovery (CDR) device.

FIG. 12 is a variation of the system of FIG. 11 where the receiver is part of a clock and data recovery (CDR) device. The system 1200 also includes elements of the system depicted in FIG. 10. In this aspect, the PLL accepts an input communication signal on line 1006 having a non-predetermined frequency. Frequency detector 1102 is depicted as a rotational frequency detector (RFD). One example of an RFD can be found in an article authored by Pottbacker et al. entitled, "A Si Bipolar Phase and Frequency Detector IC for Clock Extraction up to 8 Gb/s", IEEE Journal of Solid-State Circuits, Vol. SC-27, pp. 1747-1751, December 1992, which is incorporated herein by reference. However, other phase detector designs are also suitable.

The system further comprises a coarse determination module (CDM) 1202 having an input to accept the input communication signal on line 1006 and an output on line 1218 to supply a control signal to the MUX 1058 selecting the initial VCO (e.g., VCO 1002a). In this aspect, the CDM 1202 controls the MUX 1058 until the initial VCO is selected. After the initial VCO is selected, the FSM 1150 controls MUX 1058 to select the optimal VCO. The FSM 1150 also controls MUX 1019 via line 1020, selectively enabling different phase/frequency detectors.

Figure 13:
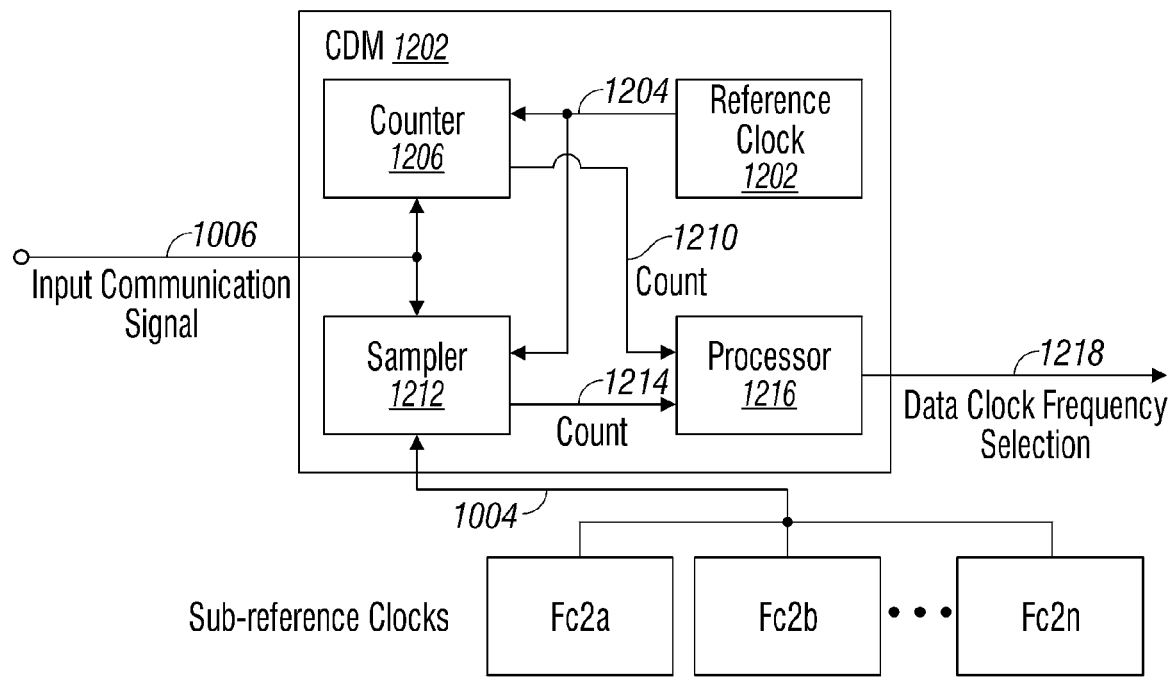
FIG. 13 is a schematic block diagram depicting the coarse determination module of FIG. 12 in greater detail.

FIG. 13 is a schematic block diagram depicting the coarse determination module 1202 of FIG. 12 in greater detail. A more complete explanation of the CDM circuitry can be found in a pending parent application entitled, SYSTEM AND METHOD FOR AUTOMATIC CLOCK FREQUENCY ACQUISITION, invented by Do et al., Ser. No. 11/595,012, filed Nov. 9, 2006, which is incorporated herein by reference.

The CDM 1202 has an input on line 1006 to receive an input communication signal serial data stream with an unknown clock frequency and an output on line 1218 to supply a coarsely determined measurement of the clock frequency. The information on line 1218 is used in selecting a VCO from a group of VCOs covering a broad range of frequencies, once the RFD is engaged. The CDM 1202 initially determines the coarse clock frequency using a first sampling measurement and supplies a finally determined coarse clock frequency using a second sampling measurement, as described in detail below.

More explicitly, a sampler 1212 has an input on line 1006 to receive the input communication signal serial data stream, an input connected to a reference clock output on line 1204, and an output on line 1214 to supply a count of transitions in the data stream sampled at a reference clock frequency. A processor 1216 has an input on line 1214 to accept the count from the sampler 1212, an input on line 1210 to accept the count from the counter 1206, and an output on line 1218 to supply the coarse clock frequency calculated in response to comparing the counts.

In one aspect, the reference clock 1202 outputs a high frequency first clock frequency (Fref1) on line 1204, which is received by the counter 1206. Note: reference clock 1202 may be the same clock that supplies the reference signal on line 1014 of FIGS. 10 and 12. The counter supplies a count of transitions in the data stream during a first time segment, responsive to Fref1. In this aspect, it is assumed that Fref1 is greater than, or equal to the frequency of the input communication signal. In a different aspect (not shown), the counter may be a register, such as a flip-flop, with Q and Q-bar inputs tied to a fixed voltage, with the data stream on line 1006 tied to a clock input. Assuming that register has a sufficient high frequency response, an accurate count of data transitions can be obtained by dividing the register output by a factor of 2. However, the invention is not limited to any particular method for obtaining an accurate count of data transitions.

The task of the sampler 1212 is to count the number of transitions in the input communication signal during the first time segment, at a plurality of sample frequencies equal to Fref1/n, where n is an integer $\geq 1$. For simplicity, whole number integers are used as an example. However, the invention could also be enabled using non-whole integers for values of n. Generally, the task of the processor 1216 is to find the lowest frequency sampling clock that provides an accurate count. Here it is assumed that the count provided by the counter 1206 is accurate. Thus, the processor 1216 compares the count for each sampling frequency, to the count for Fref1 (n=1), which is the count provided by counter 1206. The processor 1216 determines the highest sampling frequency (n=x) having a lower count than Fref1, and initially sets the data clock frequency to Fc1=Fref1/(x−1). Alternately stated, the processor 1216 compares counts as the sampling rate clock is incrementally lowered in frequency. When the count varies from the known accurate count, the sampling rate is assumed to be too low, and the sampling rate clock next highest in frequency is selected as Fc1. Note: the processor may make data transition counts and comparisons serially, using different input communication signal time segments. Alternately, a plurality of sampling rates may be measured in parallel using the same data stream time segment.

Figure 14:
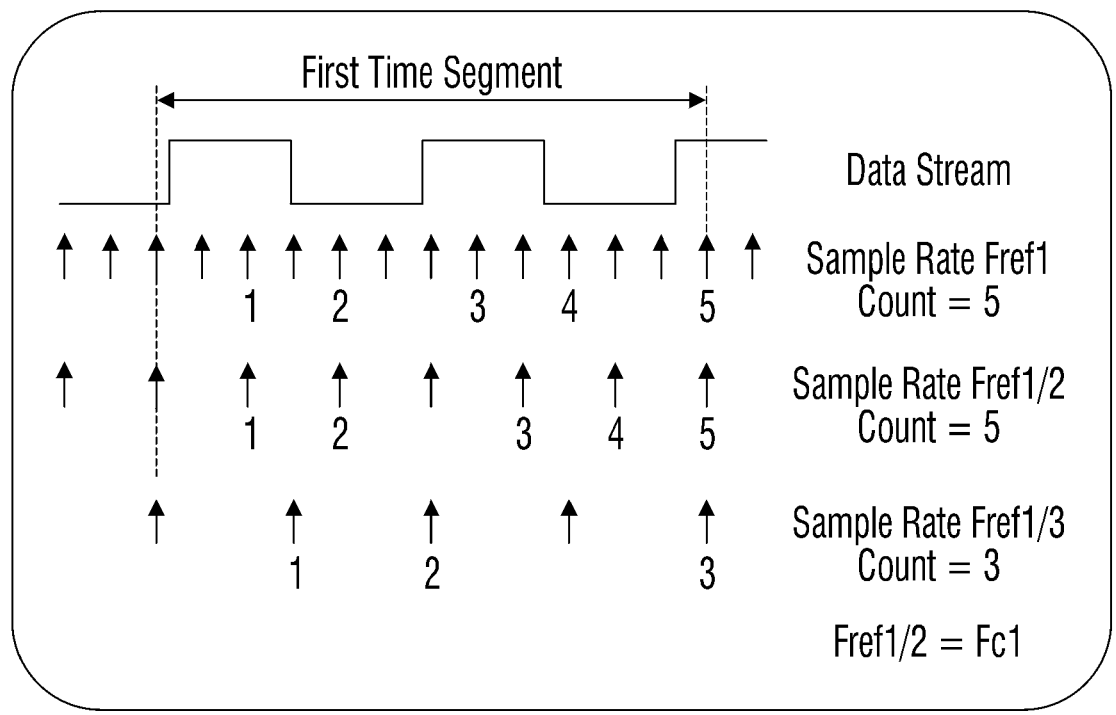
FIG. 14 is a diagram graphically depicting the selection of Fc1.

FIG. 14 is a diagram graphically depicting the selection of Fc1. Shown is an input communication signal serial data stream. The data stream is sampled at the rate Fref1 (n=1), during a first time segment, and 5 data transitions are counted. The data stream is sampled in the same time segment using a sample rate of Fref1/2 (rt=2), and 5 data transitions are counted. However, when the sampling rate is reduced to Fref1/3 (n=3), a count of 3 is obtained. So the sampling rate is known to be too low, and x=3. Therefore, Fc1 is set to Fref1/(x−1), or Fref1/2.

Returning to FIG. 13, once the input communication signal data stream clock is initially determined, a subsequent process may be engaged to more finely determine the frequency. In this aspect, a plurality of sub-reference clocks is used. The combination of sub-reference clock output frequencies covers the frequency band between Fref1/x and Fref1/(x−1). The sampler 1212 counts the number of data transitions in the first time segment of the input communication signal serial data stream at the plurality of sub-reference clock (VCO) frequencies. Note: the counted data transitions need not necessarily be from the first time segment. Further, it is not always necessary to measure each sub-reference clock. In one aspect, all the data transitions may be counted in a different (subsequent) time segment. The processor 1216 compares the counts for each sub-reference clock to the count for Fref1, determines the lowest frequency sub-reference clock (Fc2) having a count equal to Fref1, and sets the final coarse clock frequency to Fc2.

In one aspect, the plurality of sub-reference clocks 1002 are tunable sub-reference clocks, the combination of which can be tuned to cover the frequency band between Fref1/x and Fref1/(x−1). For example, the sub-reference clocks may be voltage tunable oscillators (VCOs). For example, the sub-reference clocks (Fc2) depicted in FIG. 13 may be the VCOs (1002a through 1002n) depicted in FIG. 12. The sampler 1212 counts data transitions for each sub-reference clock tuned to the low end of its frequency sub-band, and the processor 1216 determines the highest frequency sub-reference clock (Fc2) having a lower count than Fref1. It is assumed that the selected sub-reference clock Fc2 can be tuned in subsequent processes to the exact serial data stream frequency.

Figure 15:
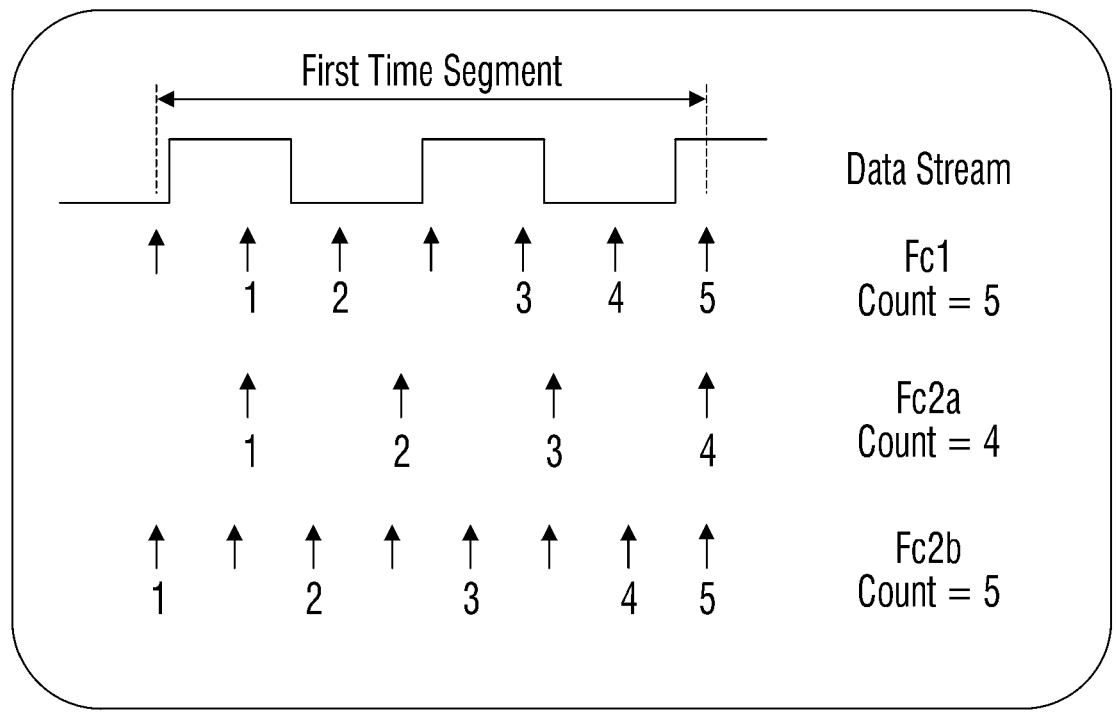
FIG. 15 is a diagram graphically depicting the process for determining Fc2.

FIG. 15 is a diagram graphically depicting the process for determining Fc2. The input communication signal data stream is sampled at the rate Fc1, which is Fref1/2, see FIG. 14. During the first time segment, 5 data transitions are counted (as in FIG. 14). The data stream is sampled in the same time segment using a sub-reference clock Fc2a, and 4 data transitions are counted. Thus, the sampling rate is too slow. Then, the data stream is sampled at Fc2b, which is the next highest frequency sub-reference clock. Here, a count of 5 is obtained, and Fc2b may be used as the final coarse frequency selection. Alternately, if the sub-reference clocks are tunable and the count measurements are performed on the low end of the band, Fc2a may selected, since it can be tuned to the exact data stream frequency, which may be desirable in some aspects of the system.

Using the initial process depicted in FIG. 14, the processor can initially determine the data clock frequency within a tolerance of about +/−100%. Using the process depicted in FIG. 15, the process can finally determine the data clock frequency within a tolerance of about +/−20%. A tunable sub-reference clock may be used to determine and track the exact frequency of the data stream.

Functional Description

In the continuous rate CDR system of FIG. 12, an array of VCO bands are used to cover the supported spectrum. In order to provide a continuous rate, each VCO band must have the lower and upper spectrum overlap with neighboring VCO bands. Since each VCO band spectrum is dependent upon by ASIC technology processing tolerances, the far end spectrums cannot ensure system stability. The optimal VCO band is the one with the maximum spectrum margin. Since the required frequency can exist in the spectrum overlap of two neighboring VCO bands, not only must the optimal VCO band be selected, but the selection process must avoid oscillating between the two VCO bands. This decision mechanism is implemented in the frequency lock stabilizer system of FIG. 12.

Figure 16:
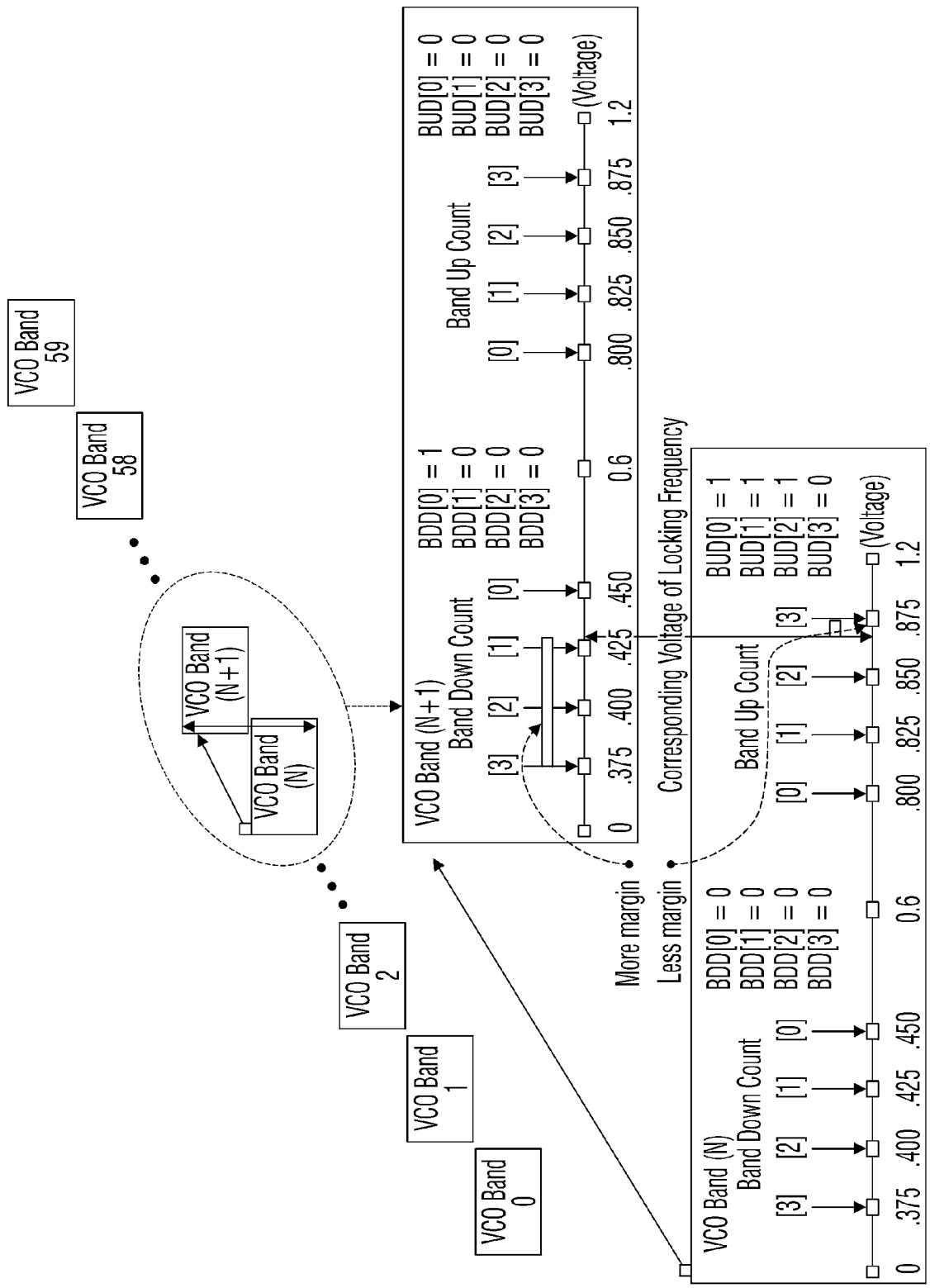
FIG. 16 is a diagram depicting overlapping VCO bands N and (N+1) in a field of 60 VCOs.

FIG. 16 is a diagram depicting overlapping VCO bands N and (N+1) in a field of 60 VCOs. In this example, 2 pairs of BandUp/BandDown counts are used to compare the spectrum margin of the $N^{th}$ VCO band and $(N+1)^{th}$ VCO band. The acquired signal tuning voltage is located in the low range (BandDown) of band (N+1) and the high range (BandUp) of band N. The BandDown Data (BDD) count is equal to 1 and the BandUp Data (BUD) count is equal to 3. The BandDown count of (N+1) being lower than the BandUp count of N signifies that band (N+1) has greater stability.

Figure 17A:
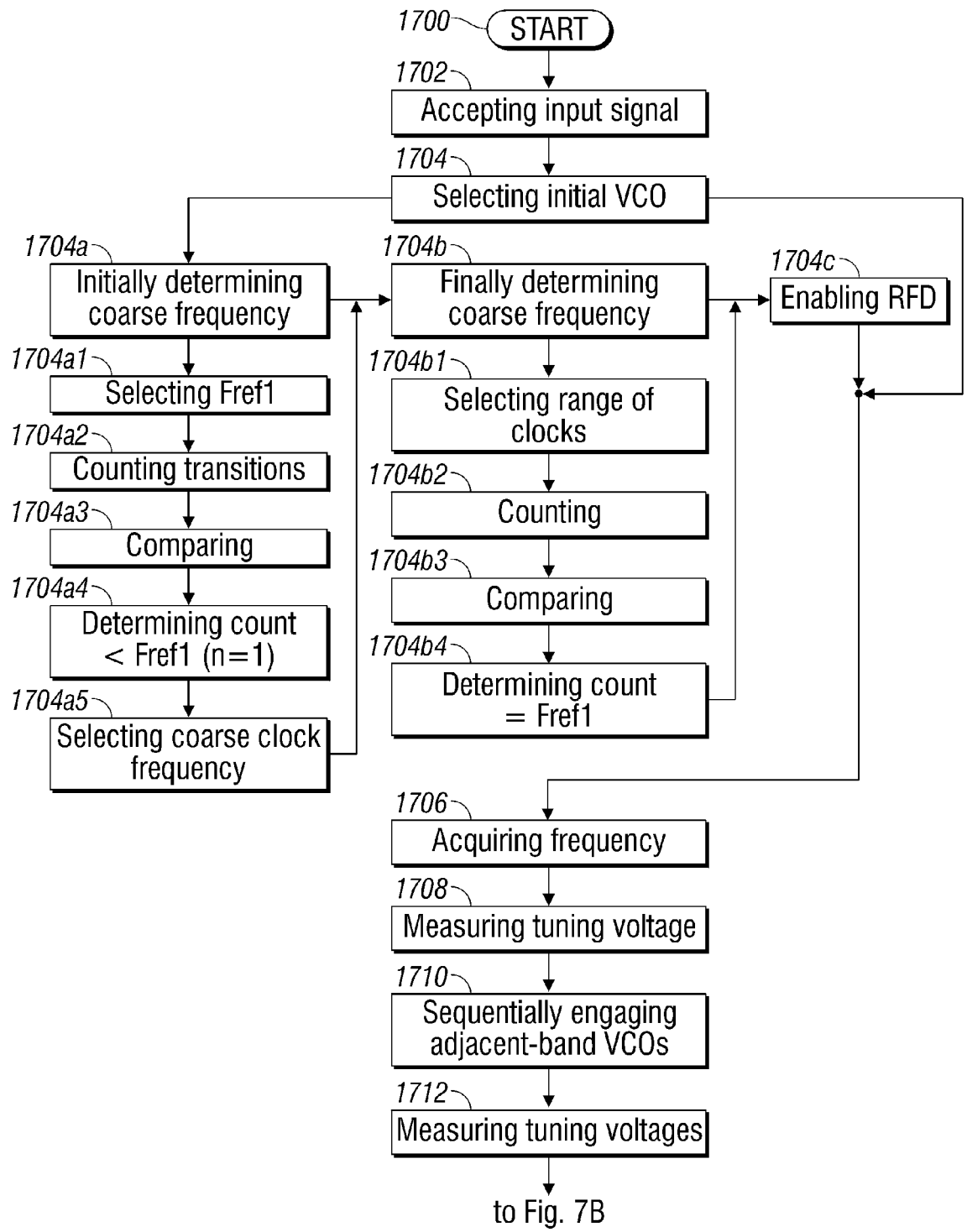
FIGS. 17A and 17B are flowcharts illustrating a method for frequency lock stability in a receiver device using overlapping VCO bands.
Figure 17B:
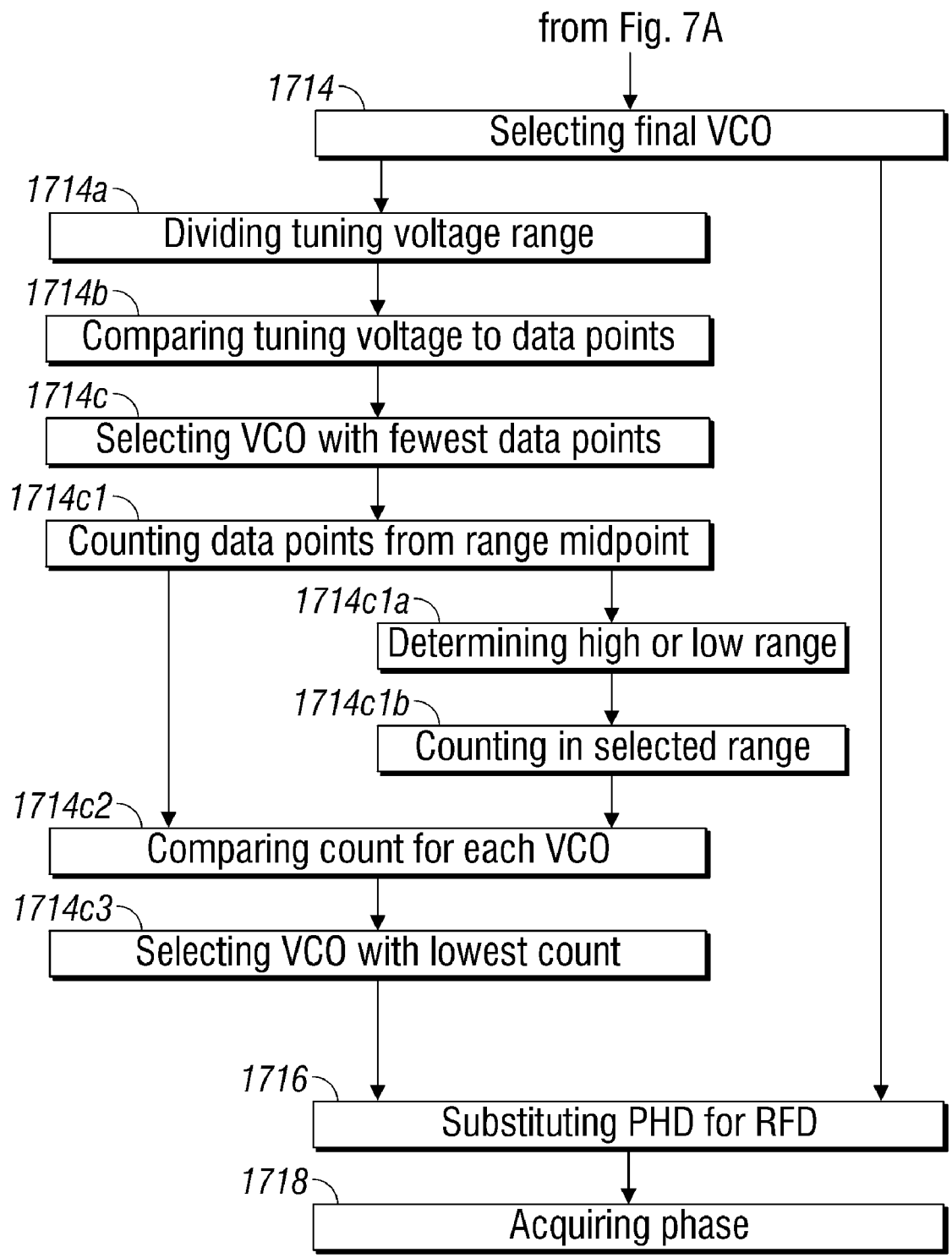

FIGS. 17A and 17B are flowcharts illustrating a method for frequency lock stability in a receiver device using overlapping VCO bands. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1700.

Step 1702 accepts an input communication signal in a receiving device including a plurality of VCOs with overlapping frequency bands. Step 1704 selects an initial VCO. Using a PLL and the initial VCO, Step 1706 acquires the frequency of the input communication signal. Step 1708 measures the acquired signal tuning voltage of the initial VCO. Step 1710 disengages the initial VCO and sequentially engages a plurality of adjacent band VCOs. Step 1712 measures the acquired signal tuning voltage of each VCO. Step 1714 selects a final VCO able to generate the input communication signal frequency using an acquired signal tuning voltage closest to a midpoint of a predetermined tuning voltage range.

In one aspect, selecting the final VCO able to generate the input communication signal frequency in Step 1714 includes substeps. Step 1714a divides the tuning voltage range into a plurality of data points. Step 1714b compares the acquired signal tuning voltage of each VCO to the data points. Step 1714c selects the VCO with the fewest number of data points between the acquired signal tuning voltage and the midpoint of the tuning voltage range.

In another aspect, Step 1714c includes the following substeps. Step 1714c1 counts the number of data points between the voltage range midpoint and the acquired signal tuning voltage for each VCO. Step 1714c2 compares the count for each VCO. Step 1714c3 selects the VCO with the lowest count.

In one aspect, dividing the voltage range into a plurality of data points in Step 1714a includes dividing the voltage range into a first plurality of low range data points between a minimum voltage and the midpoint of the tuning voltage range, and a second plurality of high range data points between a maximum voltage and the midpoint of the tuning voltage range. Then, counting the number of data points between the voltage range midpoint and the acquired signal tuning voltage in Step 1714c1 includes substeps. Step 1714c1a determines if an acquired signal is in the high range or the low range, and Step 1714c1b counts the number of data points in the selected range between the acquired signal tuning voltage and the midpoint of the tuning voltage range.

In another aspect, subsequent to acquiring the frequency of the input communication signal using the final VCO (Step 1714), Step 1716 substitutes a phase detector (PHD) for the frequency detector in the PLL, and Step 1718 acquires the phase of the input communication signal.

In another aspect, the receiver is a clock and data recovery (CDR) device and accepting the input communication signal in Step 1702 includes accepting an input communication signal having a non-predetermined frequency. Then, selecting the initial VCO in Step 1704 includes selecting the initial VCO in response to a coarse frequency acquisition (CFA) process.

Selecting the initial VCO in response to the CFA process may involves the use of the following substeps. Step 1704a initially determines a coarse clock frequency using a first sampling measurement. Step 1704b finally determines the coarse clock frequency using a second sampling measurement. Step 1704c, subsequent to determining the coarse clock frequency, enables a rotational frequency detector RFD to acquire the frequency of the input communication signal using a VCO signal generated by the initial VCO.

Initially determining the coarse clock frequency using the first sampling measurement in Step 1704a includes additional substeps. Step 1704a1 selects a high frequency first reference clock (Fref1). Step 1704a2 counts the number of data transitions in a first time segment of the input communication signal at a plurality of sample frequencies equal to Fref1/n, where n is an integer $\geq 1$. Step 1704a3 compares the count for each sampling frequency, to the count for Fref1 (n=1). Step 1704a4 determines the highest sampling frequency (n=x) having a lower count than Fref1, and Step 1704a5 sets the coarse clock frequency to Fc1=Fref1/(x−1).

Finally determining the coarse clock frequency using the second sampling measurement in Step 1704b includes additional substeps. Step 1704b1 selects a plurality of sub-reference clocks (e.g., VCOs), the combination of which covers the frequency band between Fref1/x and Fref1/(x−1). Step 1704b2 counts the number of data transitions in the first time segment of the input communication signal at the plurality of sub-reference clock frequencies. Step 1704b3 compares the count for each sub-reference clock to the count for Fref1. Step 1704b4 determines the lowest frequency sub-reference clock (Fc2) having a count equal to Fref1, and Step 1704b5 sets the final coarse clock frequency to Fc2 as the initial VCO. That is, a VCO is selected that is assumed to have Fc2 in its frequency band.

In one aspect, selecting the plurality of sub-reference clocks (Step 1704b1) includes selecting a plurality of tunable sub-reference clocks (VCOs), the combination of which can be tuned to cover the frequency band between Fref1/x and Fref1/(x−1). Then, counting the number of data transitions in the first time segment of the input communication signal at the plurality of sub-reference clock frequencies (Step 1704b2) includes: tuning each sub-reference clock to the low end of its frequency sub-band; and, counting data transitions. Finally, determining the lowest frequency sub-reference clock (Fc2) having a count equal to Fref1 (Step 1704b4) includes determining the highest frequency sub-reference clock having a lower count than Fref1.

A system and method have been provided for frequency lock stability in a receiver or CDR device. Some examples of circuitry and methodology steps have been given as examples to illustrate the invention. However, the invention is not limited to merely these examples. Other variations and embodiments of the invention will occur to those skilled in the art.

We claim:

1. In a receiver device, a method for frequency lock stability using overlapping voltage controlled oscillator (VCO) bands, the method comprising:
   in a receiving device including a plurality of VCOs with overlapping frequency bands, accepting an input communication signal;
   selecting an initial VCO;
   using a phase-locked loop (PLL) and the initial VCO, acquiring the frequency of the input communication signal;
   measuring the acquired signal tuning voltage of the initial VCO;
   disengaging the initial VCO and sequentially engaging a plurality of adjacent band VCOs;
   measuring the acquired signal tuning voltage of each VCO;
   selecting a final VCO able to generate the input communication signal frequency using an acquired signal tuning voltage closest to a midpoint of a predetermined tuning voltage range, as follows:
   dividing the tuning voltage range into a plurality of data points;
   comparing the acquired signal tuning voltage of each VCO to the data points;
   selecting the VCO with the fewest number of data points between the acquired signal tuning voltage and the midpoint of the tuning voltage range as follows:
   for each VCO the number of data points between the voltage range midpoint and the acquired signal tuning voltage;
   comparing the count for each VCO; and,
   selecting the VCO with the lowest count.

2. The method of claim 1 wherein dividing the voltage range into a plurality of data points includes dividing the voltage range into a first plurality of low range data points between a minimum voltage and the midpoint of the tuning voltage range, and a second plurality of high range data points between a maximum voltage and the midpoint of the tuning voltage range;
   wherein counting the number of data points between the voltage midpoint and the acquired signal tuning voltage includes:
   determining if an acquired signal is in a range selected from a group consisting of the high range and the low range; and,
   counting the number of data points in the selected range between the acquired signal tuning voltage and the midpoint of the tuning voltage range.

3. The method of claim 1 wherein the receiver is a clock and data recovery (CDR) device accepting the input communication signal includes accepting an input communication signal having a non-predetermined frequency; and,
   wherein selecting the initial VCO includes selecting the initial VCO in response to a coarse frequency acquisition (CFA) process.

4. The method of claim 3 wherein selecting the initial VCO in response to the CFA process includes:
   initially determining a coarse clock frequency using a first sampling measurement;
   finally determining the coarse clock frequency using a second sampling measurement;
   subsequent to determining the coarse clock frequency, enabling a rotational frequency detector RFD to acquire the frequency of the input communication signal using a VCO signal generated by the initial VCO.

5. The method of claim 4 wherein initially determining the coarse clock frequency using the first sampling measurement includes:
   selecting a high frequency first reference clock (Fref1);
   counting the number of data transitions in a first time segment of the input communication signal at a plurality of sample frequencies equal to Fref1/n, where n is an integer $\geq 1$;
   comparing the count for each sampling frequency, to the count for Fref1 (n=1);
   determining the highest sampling frequency (n=x) a lower count than Fref1; and,
   setting the coarse clock frequency to Fc1=Fref1/(x−1).

6. The method of claim 5 wherein finally determining the coarse clock frequency using the second sampling measurement includes:

selecting a plurality of sub-reference clocks, the combination of which covers the frequency band between Fref1/x and Fref1/(x−1);
counting the number of data transitions in the first time segment of the input communication signal at the plurality of sub-reference clock frequencies;
comparing the count for each sub-reference clock to the count for Fref1;
determining the lowest frequency sub-reference clock (Fc2) having a count equal to Fref1; and,
selecting the final coarse clock frequency to Fc2 as the initial VCO.

7. The method of claim 6 wherein selecting the plurality of sub-reference clocks includes selecting a plurality of tunable sub-reference clocks, the combination of which can be tuned to cover the frequency hand between Fref1/x and Fref1/(x−1);
wherein counting the number of data transitions in the first time segment of the input communication signal at the plurality of sub-reference clock frequencies includes:
tuning each sub-reference clock to the low end of its frequency sub-band; and
counting data transitions; and,
wherein determining the lowest frequency sub-reference clock (Fc2) having a count equal to Fref1 includes determining the highest frequency sub-reference clock having a lower count than Fref1.

8. The method of claim 1 further comprising:
subsequent to acquiring the frequency of the input communication signal using the final VCO, substituting a phase detector (PHD) for the frequency detector in the PLL; and,
acquiring the phase of the input communication signal.

9. In a receiver using a plurality of voltage controlled oscillators (VCOs) with overlapping frequency bands, a system for frequency lock stability comprising:
a plurality of VCOs for generating VCO signals in overlapping frequency bands;
a phase-locked loop (PLL) including:
a frequency detector to acquire the frequency of an input communication signal with respect to a VCO signal, and an output to supply a VCO tuning voltage;
an initial VCO having an input to accept the tuning voltage and an output to supply the VCO signal;
a multiplexer (MUX) having an input to accept the tuning voltage from the frequency detector, a control signal input, and a plurality of selectable outputs, each output connected to a corresponding VCO to supply the tuning voltage in response to the control signal;
a frequency stability module (FSM) having an interface to measure tuning voltage and an output to supply the control signal to the MUX, the FSM measuring the acquired signal tuning voltage of the initial VCO, disengaging the initial VCO and sequential engaging a plurality of adjacent band VCOs, the FSM measuring the acquired signal tuning voltage of each VCO and selecting a final VCO able to generate the input communication signal frequency using an acquired signal tuning voltage closest to a midpoint of a predetermined tuning voltage range, the FSM comprising a controller to supply data point voltages, a comparator having a first input to accept the acquired signal tuning voltage, a second input to accept the data point voltages, and an output to supply a voltage comparison, and a memory to record the voltage comparisons for each VCO;
wherein, the memory records a count of the number of data points between the tuning voltage range midpoint and the acquired signal tuning voltage for each VCO; and,
wherein the controller accesses the count for each VCO from memory and selects the VCO with the lowest count.

10. The system of claim 9 wherein the controller supplies the comparator with data points for each VCO selected from a group consisting of a first plurality of lour range data points between a minimum voltage and the midpoint of the tuning voltage range, and a second plurality of high range data points between a maximum voltage and the midpoint of the tuning voltage range; and,
wherein the memory records a count of the number of data points in the selected range between the acquired signal tuning voltage and the midpoint of the tuning voltage range.

11. The system of claim 9 wherein the receiver is a clock and data recovery (CDR) device;
wherein the PLL accepts an input communication signal having a non-predetermined frequency; and,
the system further comprising:
a coarse determination module (CDM) having an input accept the input communication signal and an output to supply a control signal to the MUX selecting the initial VCO.

12. The system of claim 11 wherein the CDM initially determines the coarse clock frequency using a first sampling measurement and supplies a finally determined coarse clock frequency using a second sampling measurement; and,
wherein the PLL frequency detector in a rotational frequency detector (RFD) selectively enabled subsequent to determining the coarse clock frequency, to acquire the frequency of the input communication signal using a VCO signal generated by the initial VCO.

13. The system of claim 12 further comprising:
a reference clock having an output to supply a high frequency first reference clock frequency Fref1;
wherein the CDM has an input connected to the reference clock output, the CDM initially determining the coarse clock frequency as follows:
counting the number of data transitions in a first time segment of the input communication signal at a plurality of sample frequencies equal to Fref1/n, where n is an integer $\geq 1$;
comparing the count for each sampling frequency, to the count for Fref1 (n=1);
determining the highest sampling frequency (n=x) having a lower count than Fref1; and,
setting the coarse clock frequency to Fc1=Fref1/(x−1).

14. The system of claim 13 wherein the CDM further comprising:
a plurality of sub-reference clocks, the combination of which covers the frequency band between Fref1/x and Fref1/(x−1);
wherein the CDM finally determines the coarse clock frequency as follows:
counting the number of data transitions in the first time segment of the input communication signal at the plurality of sub-reference clock frequencies;
comparing the count for each sub-reference clock to the count for Fref1;
determining the lowest frequency sub-reference clock (Fc2) having a count equal to Fref1; and,
setting the final coarse clock frequency to Fc2 and selecting the lowest sub-reference clock as the initial VCO.

15. The system of claim 14 wherein the plurality of sub-reference clocks are tunable sub-reference clocks, the combination of which can be tuned to cover the frequency band between Fref1/x and Fref1/(x−1);
  wherein the CDM counts the number of data transitions in the first time segment of the input communication signal at the plurality of sub-reference clock frequencies as follows:
    tuning each sub-reference clock to the low end of its frequency sub-band;
    counting data transitions; and,
    determining the highest frequency sub-reference clock having a lower count than Fref1.

16. The system of claim 9 wherein the frequency detector is a selectively enabled; and,
  wherein the PLL includes a phase detector (PHD) selectively enabled subsequent to the frequency detector acquiring the frequency of the input communication signal using the final VCO, to acquire the phase of the input communication.

17. In a receiver device, a method for frequency lock stability using overlapping voltage controlled oscillator (VCO) bands, the method comprising:
  in a clock and data recovery (CDR) device including a plurality of VCOs with overlapping frequency bands, accepting an input communication signal having a non-predetermined frequency;
  selecting an initial VCO in response to a coarse frequency acquisition (CFA) process as follows:
    initially determining a coarse clock frequency using a first sampling measurement;
    finally determining the coarse clock frequency using a second sampling measurement;
    subsequent to determining the coarse clock frequency, enabling a rotational frequency detector RFD to acquire the frequency of the input communication signal using a VCO generated by the initial VCO;
  using a phase-locked loop (PLL) and the initial VCO, acquiring the frequency of the input communication signal;
  measuring the acquired signal tuning voltage of the initial VCO;
  disengaging the initial VCO and sequentially engaging a plurality of adjacent band VCOs;
  measuring the acquired signal tuning voltage of each VCO; and,
  selecting a final VCO able to generate the input communication signal frequency using an acquired signal tuning voltage closest to a midpoint of a predetermined, tuning voltage range.

18. The method of claim 17 wherein initially determining the coarse clock frequency using the first sampling measurement includes:
  selecting a high frequency first reference clock (Fref1);
  counting the number of data transitions in a first time segment of the input communication signal at a plurality of sample frequencies equal to Fref1/n, where n is an integer $\geq 1$;
  comparing the count for each sampling frequency, to the count for Fref1 (n=1);
  determining the highest sampling frequency having a lower count than Fref1; and,
  setting the coarse clock frequency to Fc1=Fref1/(x−1).

19. The method of claim 18 wherein finally determining the coarse clock frequency using the second sampling measurement includes:
  selecting a plurality of sub-reference clocks, the combination of which covers the frequency band between Fref1/x and Fref1/(x−1);
  counting the number of data transitions in the first time segment of the input communication signal at the plurality of sub-reference clock frequencies;
  comparing the count for each sub-reference clock to the count for Fref1;
  determining the lowest frequency sub-reference clock (Fc2) having a count equal to Fref1; and,
  selecting the final coarse clock frequency to Fc2 as the initial VCO.

20. The method of claim 17 further comprising:
  subsequent to acquiring the frequency of the input communication signal, using the final VCO, substituting a phase detector (PHD) for the frequency detector in the PLL; and,
  acquiring the phase of the input communication signal.

* * * * *

UNITED STATES PATENT AND TRADEMARK OFFICE
CERTIFICATE OF CORRECTION

PATENT NO. : 8,121,242 B2
APPLICATION NO. : 12/388024
DATED : February 21, 2012
INVENTOR(S) : Viet Do et al.

It is certified that error appears in the above-identified patent and that said Letters Patent is hereby corrected as shown below:

In column 20, line 6 (claim 10), the word "low" has been incorrectly printed as "lour".

Column 20, lines 4-10, Claim 10 should be printed as follows:

-- 10. The system of claim 9 wherein the controller supplies the comparator with data points for each VCO selected from a group consisting of a first plurality of low range data points between a minimum voltage and the midpoint of the tuning voltage range, and a second plurality of high range data points between a maximum voltage and the midpoint of the tuning voltage range; and,
 wherein the memory records a count of the number of data points in the selected range between the acquired signal tuning voltage and the midpoint of the tuning voltage range. --

Signed and Sealed this
Twenty-seventh Day of March, 2012

David J. Kappos
*Director of the United States Patent and Trademark Office*